(12) United States Patent
Otani et al.

(10) Patent No.: US 7,297,989 B2
(45) Date of Patent: Nov. 20, 2007

(54) DIBORIDE SINGLE CRYSTAL SUBSTRATE, SEMICONDUCTOR DEVICE USING THIS AND ITS MANUFACTURING METHOD

(75) Inventors: Shigeki Otani, Ibaraki (JP); Hiroyuki Kinoshita, Kyoto (JP); Hiroyuki Matsunami, Kyoto (JP); Jun Suda, Shiga (JP); Hiroshi Amano, Aichi (JP); Isamu Akasaki, Aichi (JP); Satoshi Kamiyama, Aichi (JP)

(73) Assignees: National Institute for Materials Science, Ibaraki (JP); Kyocera Corporation, Kyoto (JP)

( * ) Notice: Subject to any disclaimer, the term of this patent is extended or adjusted under 35 U.S.C. 154(b) by 97 days.

(21) Appl. No.: 10/525,753

(22) PCT Filed: Aug. 21, 2003

(86) PCT No.: PCT/JP03/10575

§ 371 (c)(1),
(2), (4) Date: Sep. 16, 2005

(87) PCT Pub. No.: WO2004/018743

PCT Pub. Date: Mar. 4, 2004

(65) Prior Publication Data
US 2006/0102924 A1 May 18, 2006

(30) Foreign Application Priority Data
Aug. 26, 2002 (JP) .............................. 2002-244895

(51) Int. Cl.
*H01L 33/00* (2006.01)

(52) U.S. Cl. .......................... 257/103; 257/97; 257/99; 257/101; 257/102; 438/384; 438/393; 438/791; 372/43.01

(58) Field of Classification Search ................ None
See application file for complete search history.

(56) References Cited

FOREIGN PATENT DOCUMENTS

EP         1 176 231      *   1/2002

(Continued)

OTHER PUBLICATIONS

Shigeki Otani et al., "Chisso Gallium to Koshi Seigo Suru Niho-ka Zirconium Kiban" Jun. 1, 2002, vol. 50, No. 6, pp. 97-100.

(Continued)

*Primary Examiner*—Sue A. Purvis
*Assistant Examiner*—Fazli Erdem
(74) *Attorney, Agent, or Firm*—Westerman, Hattori, Daniels & Adrian, LLP.

(57) ABSTRACT

Disclosed are a diboride single crystal substrate which has a cleavage plane as same as that of a nitride compound semiconductor and is electrically conductive; a semiconductor laser diode and a semiconductor device using such a substrate and methods of their manufacture wherein the substrate is a single crystal substrate 1 of diboride $XB_2$ (where X is either Zr or Ti) which is facially oriented in a (0001) plane 2 and has a thickness of 0.1 mm or less. The substrate 1 is permitted cleaving and splitting along a (10-10) plane 4 with ease. Using this substrate to form a semiconductor laser diode of a nitride compound, a vertical structure device can be realized. Resonant planes of a semiconductor laser diode with a minimum of loss can be fabricated by splitting the device in a direction parallel to the (10-10) plane. A method of manufacture that eliminates a margin of cutting is also realized.

19 Claims, 19 Drawing Sheets

FOREIGN PATENT DOCUMENTS

| | | |
|---|---|---|
| EP | 1 176 231 A2 | 1/2002 |
| JP | 2001-253800 | 9/2001 |
| JP | 2003-163375 | 6/2003 |

OTHER PUBLICATIONS

J. Suda et al., Journal of Crystal Growth, 237-239, (2002) pp. 1114-1117.

* cited by examiner (a)

(b)

(a)

(b)

(c)

(d)

(e)

(a)

(b)

(c)

(d)

DIBORIDE SINGLE CRYSTAL SUBSTRATE, SEMICONDUCTOR DEVICE USING THIS AND ITS MANUFACTURING METHOD

TECHNICAL FIELD

The present invention relates to a substrate as needed for a nitride compound semiconductor and also to a semiconductor laser diode and more generally a semiconductor device, using such a substrate, and further to a method of making such devices.

BACKGROUND ART

Devices such as a semiconductor laser diode (hereinafter referred to as "LD") and a light emitting diode (hereinafter referred to as "LED") are applied to a variety of apparatus such as optical disk devices. In recent years, in order to obtain such an optical disk device that is larger in storage capacity, LEDs and LDs are being developed using a nitride compound semiconducting material capable of emitting light in a blue to ultraviolet region that is short in wavelength. A nitride compound semiconductor has a high breakdown voltage owing to it's a large energy band gap. Also, being large in mobility and hence excelling in high frequency properties, a nitride compound semiconductor is being used to develop various types of transistors.

Nitride semiconductor devices such as LDs and high frequency transistors have thus been developed to form such a semiconductor device on a sapphire single crystal substrate, since a substrate of the nitride compound semiconductor such as gallium nitride (GaN) for example is not satisfactory in quality.

Conventional methods of making a LD using a nitride compound semiconductor was disclosed in JP H07-297495 A, which is referred to herein as a first prior art. FIG. 19 is a cross sectional view illustrating the structure of a LD according to the first prior art. As shown the LD, denoted by reference character 40, has a multilayer structure forming its active layers successively built on (11-20) planes of a single crystal sapphire substrate 41, the structure comprising an AlN buffer layer 42, an n$^+$GaN layer 43, a nAl$_{0.1}$Ga$_{0.9}$N layer 44, a GaN layer 45 and a pAl$_{0.1}$Ga$_{0.9}$N layer 46 wherein the uppermost layer: p Al$_{0.1}$Ga$_{0.9}$N layer 46 has a SiO$_2$ film 47 deposited thereon and opened for an electrode window where an electrode 48A is formed for the p layer 46. While an electrode 48B for the n layer 44 is formed on the n$^+$GaN layer 43. The LD 40 has a Fabry-Perot resonator whose resonant faces are made by a pair of opposite end faces which are opposed to each other in a direction perpendicular to the optical path of laser light emitted (in a direction perpendicular to the sheet of paper).

The first prior art teaches that the opposed end faces defining the resonator are obtained by cleaving the sapphire single crystal substrate 41 along its <0001> axis (c-axis), followed by its splitting, and further teaches that this allows the efficiency of oscillations by the LD 40 using a nitride compound semiconductor to be improved by mirror-finishing the opposed end faces with precision.

On the other hand there is a report that a zirconium diboride (ZrB$_2$) substrate is a promising substrate for a nitride compound semiconductor (J. Suda, H. Matsunami, Journal of Crystal Growth, Vol. 237-239, pp. 210-213, 2002), which is referred to herein as a second prior art. As taught there, a ZrB$_2$ substrate can be obtained in the form of a single crystal in a floating zone method (FZ) by high frequency induction heating, is well lattice matched with a nitride compound semiconductor, and has a good electrical conductivity. It is further shown that a nitride compound semiconductor can be epitaxially grown on a ZrB$_2$ substrate.

While the first prior art in making a LD seeks to provide a (10-12) cleavage face by cleaving the sapphire substrate 41 along its c-axis, the incongruity of such a crystallographic plane with a (10-10) plane in which the nitride compound semiconductor is to be cleaved gives rise to the problem that a stable cleavage face can seldom be obtained stably therefor. As a result, the problem in turn arises that because of the inability to ensure facial precision and parallelism of the opposed end faces providing the Fabry-Perot resonator for a nitride compound semiconductor, LDs high in oscillation efficiency cannot be obtained at an acceptable yield.

A LD using III-V group semiconductor is a so-called a vertical structure device in which the front surface of active layers and the rear surface of a substrate are provided with ohmic electrodes to flow the electric current from the front side to the rear side of the substrate. Such a vertical structure device cannot here be realized, however, since the sapphire single crystal substrate 41 being an insulator cannot provide an ohmic electrode at its rear surface. Thus, for the LD 40, it is necessary to form the electrode 48B on the n$^+$ layer 43 as a lower part of the multi-layer structure and as on an upper surface of the device. Then, exposing the n$^+$ layer 43 on an upper surface of the device in the course of crystal growth of LD multiple layers requires suspending crystal growth when the n+ layer 43 has grown and covering such an electrode area with an insulator such as SiO$_2$ 47 while preventing crystal growth, followed by crystal growth of further layers, and thus performing the so-called selective growth. And, after the multiple layers have been formed, it is required to perform a further step of exposing the n$^+$ or electrode region to a device surface by etching. These added process steps give rise to problems of reduced yield and additional cost.

Further, the low thermal conductivity of a sapphire single crystal substrate 41 causes a nitride compound semiconductor such as a LD 40 using it to tend to rise in temperature while in operation with the result that the LD 40 has a very limited life and the high frequency transistor fails to achieve desired output and efficiency. Hence, there is the problem that a sapphire single crystal substrate 41 prevents a nitride compound semiconductor device from fully exhibiting its essential performance.

As for the second prior art, using a ZrB$_2$ substrate as a substrate, for example, a LD requires the ZrB$_2$ substrate to be cleaved simultaneously in forming the resonant faces of the LD. There is, however, the problem that the clear cleavage plane of a ZrB$_2$ substrate has not yet been identified.

DISCLOSURE OF THE INVENTION

In view of the problems mentioned above, it is an object of the present invention to provide a substrate that has a cleavage face as same as that of a nitride compound semiconductor and is electrically conductive. Further objects of the present invention are to provide a semiconductor device e.g., a semiconductor laser diode, using such a substrate and to provide a method of making such devices.

In order to achieve the objects mentioned above, there is provided in accordance with a present invention a diboride single crystal substrate that is a single crystal substrate of diboride XB$_2$ (where X is either Zr or Ti), characterized in that the substrate is facially oriented in a (0001) plane, has an orientation flat exhibiting a (10-10) or (11-20) plane and has a thickness of 0.1 mm or less whereby the substrate can be cleaved in a (10-10) plane.

The present invention also provides a semiconductor laser diode having a multilayered active layer is formed on a substrate of diboride $XB_2$ single crystal (where X is either Zr or Ti) which is facially oriented in a (0001) plane of the single crystal, characterized in that a pair of opposed end faces defining a semiconductor laser light resonator in the multilayered active layer and opposed end faces of the diboride $XB_2$ single crystal substrate are each constituted by a cleavage face oriented parallel to a (10-10) plane of the diboride $XB_2$ single crystal substrate.

The diboride $XB_2$ single crystal substrate may have a thickness of 0.1 mm or less. Also, the diboride $XB_2$ single crystal substrate may be a $ZrB_2$ single crystal substrate, and the multilayered active layer of the semiconductor laser diode may comprise a nitride compound semiconductor ($Al_xGa_yIn_zN$ where $x+y+z=1$).

In accordance with this constitution, making a $XB_2$ single crystal substrate 0.1 mm or less in thickness before or after having a semiconductor laser diode formed thereon permits the $XB_2$ substrate and the semiconductor laser diode to be divided along a (10-10) plane of a nitrogen compound semiconductor making up the semiconductor laser diode easily and with a due linearity and further allows a pair of opposed end faces that define a resonator for the semiconductor laser diode to be easily formed. This also establishes a method whereby a device can be divided without any cutting margin.

The present invention also provides a semiconductor device that is formed on a substrate of a diboride $XB_2$ single crystal (where X is Zr or Ti) which is facially oriented in a (0001) plane of the single crystal, characterized in that those at least at one side of side faces of the diboride $XB_9$ single crystal substrate and of a device constituting a semiconductor device are constituted by cut faces resulting from cleaving the substrate and the device parallel to a (10-10) plane of the diboride $XB_2$ single crystal substrate.

The semiconductor device may be a semiconductor laser diode, a light emitting diode, a photo detector, a heterojunction bipolar transistor, a field effect transistor or an integrated circuit. The diboride $XB_2$ single crystal substrate preferably has a thickness of 0.1 mm or less. Also, it is preferable that the diboride $XB_2$ single crystal substrate is a $ZrB_2$ single crystal substrate and the semiconductor device comprises a nitride compound semiconductor ($Al_xGa_yIn_zN$ where $x+y+z=1$).

In accordance with this constitution, making a $XB_2$ single crystal substrate 0.1 mm or less in thickness before or after having a semiconductor device formed thereon permits the $XB_2$ substrate and the semiconductor device to be divided along a (10-10) plane of a nitrogen compound semiconductor making up the semiconductor device easily and with a due linearity. This constitution also permits using $XB_2$ to form a substrate for a nitrogen compound semiconductor and thereby forming a nitrogen compound semiconductor device of a vertical structure having an electrode formed on the substrate side.

The present invention also provides a method of making a semiconductor laser diode, characterized in that it comprises the steps of: forming active layers of the semiconductor laser diode on a substrate of a diboride $XB_2$ single crystal (where X is Zr or Ti) that is facially oriented in a (0001) plane of the single crystal; and scribing the diboride $XB_2$ single crystal substrate along a (10-10) plane thereof and cutting the semiconductor device's active layers together with the substrate into a plurality of their divisions each individually constituting a semiconductor laser diode.

Prior to the step of scribing the diboride $XB_2$ single crystal substrate along a (10-10) plane thereof and cutting the semiconductor device's active layers together with the substrate into a plurality of their divisions, the method may further include the step of thinning the diboride $XB_2$ single crystal substrate to 0.1 mm or less in thickness. The diboride $XB_2$ single crystal substrate preferably is thinned to a thickness of 0.1 mm or less. Also, it is preferable that the diboride $XB_2$ single crystal substrate be a $ZrB_2$ single crystal substrate and the semiconductor laser diode have multiple active layers made of a nitride compound semiconductor ($Al_xGa_yIn_zN$ where $x+y+z=1$).

In accordance with this constitution, making a $XB_2$ single crystal substrate 0.1 mm or less in thickness before or after having a semiconductor laser diode formed thereon permits the $XB_2$ substrate and the semiconductor laser diode to be divided along a (10-10) plane of a nitrogen compound semiconductor making up the semiconductor laser diode easily and with a due linearity and further allows a pair of opposed end faces that define a resonator for the semiconductor laser diode to be easily formed. This also establishes a method whereby a device can be divided without any cutting margin.

The present invention further provides a method of making a semiconductor device, characterized in that it comprises the steps of: forming a semiconductor device on a substrate of a diboride $XB_2$ single crystal (where X is either Zr or Ti) that is facially oriented in a (0001) plane of the single crystal; and dividing the semiconductor device on the diboride $XB_2$ single crystal substrate by cutting the device parallel to a (10-10) plane of the diboride $XB_2$ single crystal substrate. The step of cutting the device preferably comprises cleaving. Further, prior to the step of dividing the semiconductor device on the diboride $XB_2$ single crystal substrate by cutting the device parallel to a (10-10) plane of the diboride $XB_2$ single crystal substrate, the method further comprises the step of thinning the diboride $XB_2$ single crystal substrate to 0.1 mm or less in thickness. The diboride $XB_2$ single crystal substrate preferably is thinned to a thickness of 0.1 mm or less. Also, it is preferable that the diboride $XB_2$ single crystal substrate be a $ZrB_2$ single crystal substrate and the semiconductor laser diode have multiple active layers made of a nitride compound semiconductor ($Al_xGa_yIn_zN$ where $x+y+z=1$).

In accordance with this constitution, making a $XB_2$ single crystal substrate 0.1 mm or less in thickness before or after having a semiconductor device formed thereon permits the $XB_2$ substrate and the semiconductor device to be divided along a (10-10) plane of a nitrogen compound semiconductor making up the semiconductor device easily and with a due linearity. This constitution also permits using $XB_2$ to form a substrate for a nitrogen compound semiconductor and forming a nitrogen compound semiconductor device of a vertical structure having an electrode formed on the substrate side.

Also, using $ZrB_2$ to form a substrate for a nitrogen compound semiconductor allows forming a nitrogen compound semiconductor device of a vertical structure having an electrode formed on the substrate side.

BRIEF DESCRIPTION OF THE DRAWINGS

The present invention will better be understood from the following detailed description and the drawings attached hereto showing certain illustrative forms of implementation of the present invention. In this connection, it should be noted that such forms of implementation illustrated in the accompanying drawings hereof are intended in no way to limit the present invention but to facilitate an explanation and understanding thereof. In the drawings, FIG. 1 has views diagrammatically illustrating the structure of an $XB_2$ single crystal substrate that represents a first form of implementation of the present invention.

BEST MODES FOR CARRYING OUT THE INVENTION

Figure 1:
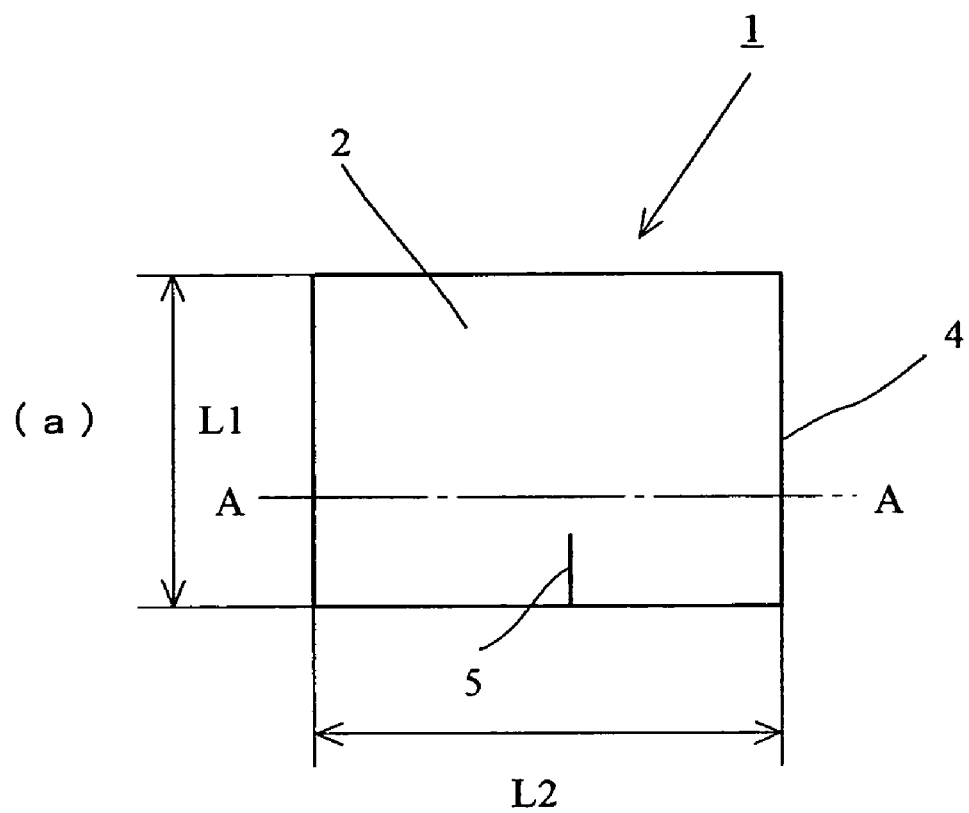
Figure 1:
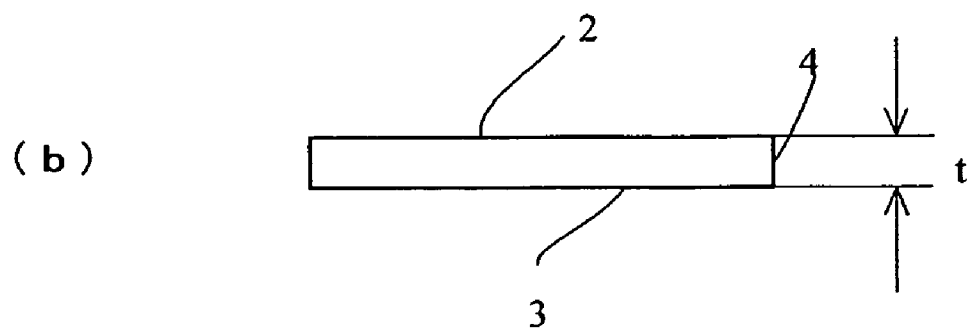

Hereinafter, the present invention will be described in detail with reference to certain suitable forms of implementation thereof illustrated in the drawing figures.

At the outset, an explanation is given in respect of a substrate that represents a first form of implementation of the present invention.

FIG. 1 has views diagrammatically illustrating the structure of a substrate that represents a first form of implementation of the present invention wherein FIG. 1($a$) is a plan view of a diboride $XB_2$ single crystal substrate and FIG. 1($b$) is a cross sectional view taken along the line A-A in FIG. 1($a$). In FIG. 1, the single crystal substrate, denoted by reference character 1, consists of diboride $XB_2$ (where X is either Zr (zirconium) or Ti (titanium) and B is boron.

Here, mention is made of the single crystal substrate 1 as being made of $ZrB_2$ when X is Zr as an example. The $ZrB_2$ single crystal substrate 1 has its main surface or front face 2 constituted by a (0001) crystallographic plane and having a short side L1 and a long side L2, the short side 4 having its side face constituted by either (10-10) or (11-20) crystallographic plane and being orientation flat.

FIG. 1($b$) is a cross sectional view taken along the line A-A in FIG. 1($a$). The substrate has its rear face denoted by reference character 3. The substrate 1 has a thickness t that is preferably 0.1 mm or less for ease of cleaving the substrate 1 as mentioned below.

Mention is next made of cleaving $ZrB_2$ single crystal substrate of the present invention. A $ZrB_2$ single crystal substrate 1 having a thickness of 0.06 mm as shown in FIG. 1 is scribed using a diamond pen on its front or rear face 2 or 3 under a pressure applied to the (0001) face 2 parallel to the (10-10) plane 4 with a scribe line 5 as a base line for cleaving.

Mention is next made of operations and effects of a substrate of the present invention.

A large number of $ZrB_2$ single crystal substrates were prepared and cleaved by applying a mechanical or thermal shock to each of them. Thorough observation of the cut surfaces they then had indicates that a $ZrB_2$ single crystal substrate with its principal surface constituted by (0001) crystallographic plane 2 and its thickness reduced to 0.1 mm or less can be cleaved or broken linearly with its cut surface made parallel to (10-10) plane 4 and along a nodal line where (10-10) plane 4 and (10-11) plane intersect in the (0001) plane 2. Thus, while a $ZrB_2$ single crystal substrate 1 with a (0001) face 2 has hitherto been deemed difficult to cleave, it has been found that this can be done to provide a favorable cut surface when the substrate is reduced in thickness to 0.1 mm or less and further it has turned out to be in a (10-10) plane that provides such a favorable cut surface in a so thinned $ZrB_2$ single crystal substrate 1 with a (0001) face 2, rather than in a (10-11) plane as an intrinsic cleavage plane thereof.

The fact that it is in (10-10) plane 4 that provides a favorable cut surface in such a thinned $ZrB_2$ single crystal substrate 1, rather than in a (10-11) plane as an intrinsic cleavage plane thereof can be reasoned as below.

Figure 2:
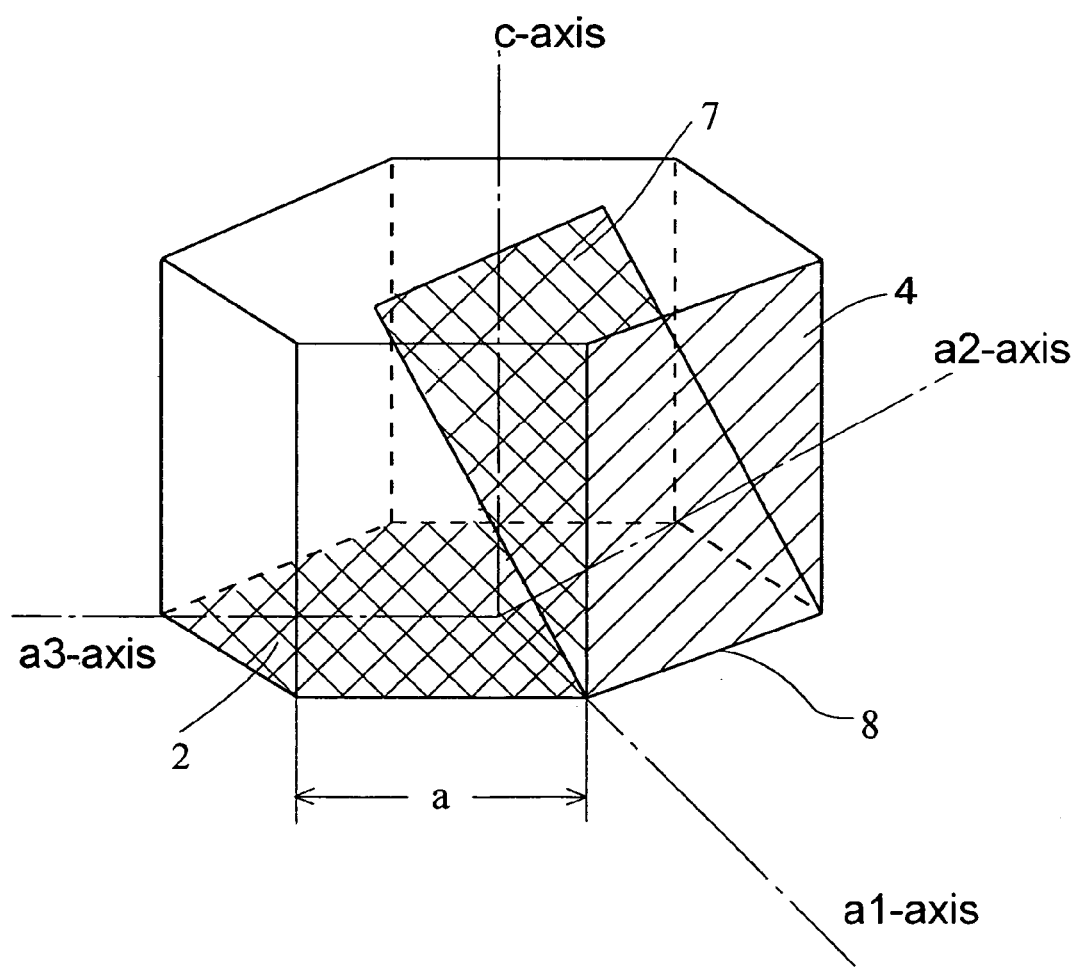
FIG. 2 is a diagram illustrating relative positions of principal planes in a $ZrB_2$ single crystal substrate.

First, the relationship in position between a (10-11) plane and a (10-10) plane 4 in a $ZrB_2$ single crystal substrate 1 is to be noted. FIG. 2 is a diagram illustrating relative positions of principal planes in a $ZrB_2$ crystal. $ZrB_2$ has a crystallographic structure of hexagonal system in which a1-axis, a2-axis and a3-axis lie to extend in the base of a hexagonal pole and c-axis extends in a direction perpendicular to the base. As shown, the base of the hexagonal pole lies in a (0001) plane 2 and is hexagonal having a side whose length is equal to a lattice constant a. It is also shown that the (0001) plane 2 makes an angle of 90° with a (10-10) plane 4 and an angle of 52.15° with a (10-11) plane 7. And the (10-11) and (10-10) planes 7 and 4 intersect at a nodal line 8 in the (0001) plane 2.

Figure 3:
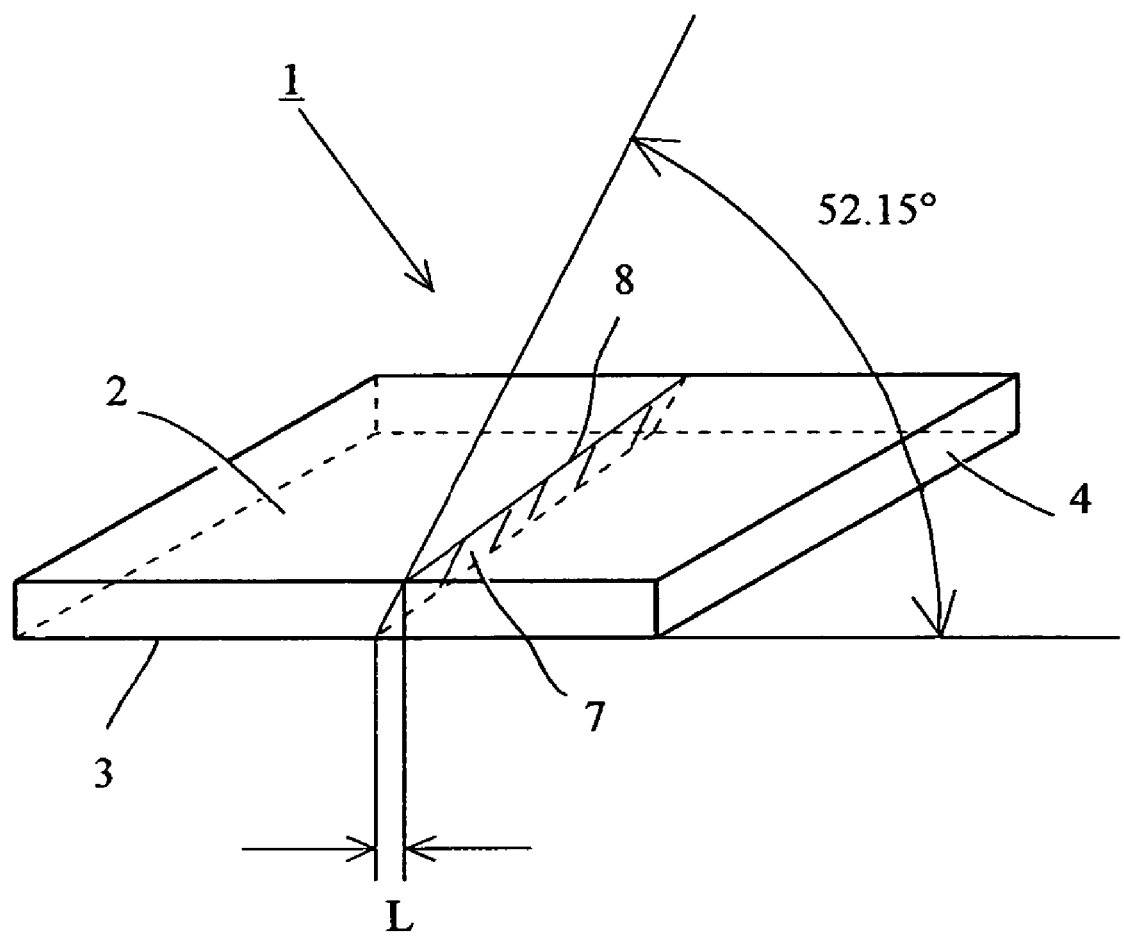
FIG. 3 is a perspective view illustrating a relative position of (10-11) plane in a substrate having a (0001) face in a $ZrB_2$ single crystal substrate.

FIG. 3 is a perspective view illustrating a relative position of (10-11) plane in a substrate having a (0001) face in a $ZrB_2$ single crystal substrate. As shown, the angle that the (10-11) plane 7 which is an intrinsic cleavage plane makes with the (0001) plane 2 is 52.15° and not 90°. As a result, there develops a deviation between the nodal lines at which the (10-11) plane 7 intersects the front and rear surfaces 2 and 3, respectively, of a $ZrB_2$ single crystal substrate 1.

Why can the $ZrB_2$ single crystal substrate 1 be favorably cleaved in a (10-10) plane 4, rather than in a (10-11) plane 7 as an instinct cleavage plane? First of all, that will be because a stress exerted subsequent to scribing is hard to be impressed on the intrinsic (10-11) plane 7 that is not perpendicular to the (0001) plane 2.

Next, it is thought that since the (10-11) plane 7 is higher than the (10-10) plane 4 in yield point to a stress applied subsequent to scribing, the substrate is easier to be cut in the (10-10) plane 4. To wit, if the substrate is thinned, it is presumed that even if a difference in yield point to a given stress between the (10-10) plane 4 easier to be cut and the (10-11) plane 7 harder to be cut, the (10-10) plane 4 easier to be cut will take the lead in being cut.

On the other hand, as the $ZrB_2$ single crystal substrate 1 is made thicker, it is presumed that the (10-10) plane 4 which was easier to be cut if the substrate is thinner will have its yield point to a stress increased, thus becoming hard to be cut easily, too. As a result, the substrate will be broken with its cut surface bending from the (10-10) plane 4.

As for a $TiB_2$ single crystal substrate, the (10-11) plane 7 makes an angle of 50.9° with the (0001) plane 2 and it is shown that such a substrate, too, can be cleaved in the (10-10) plane 4, as is the $ZrB_2$ single crystal substrate 1 to provide a favorable cut surface stably when the substrate has its thickness reduced to 0.1 mm or less.

A $ZrB_2$ single crystal substrate has a lattice constant of a=3.169 Å which is close to lattice constants: a=3.189 Å and 3.112 Å of GaN and AlN as nitride compound semiconductors and can thus be lattice matched with them.

$Ga_xAl_{1-x}N$ as a mixed crystal nitride compound semiconductor has its lattice constant varying according to its composition ratio, which according to the Vegard's law can take a value between those of GaN and AlN, and can then be lattice matched favorably with a $ZrB_2$ single crystal substrate here.

A $ZrB_2$ single crystal substrate is chemically stable and has a specific resistance of several $\mu\Omega\cdot cm$. This substrate is optimum for use as a substrate and an electrode for a diode or bipolar device using a nitride compound semiconductor, namely, as a substrate and an electrode in a vertical structure device in which an electric current is flown from a front side of the device vertically to the substrate. Further, a $ZrB_2$ single crystal substrate 1 has a thermal conductivity that is substantially equal to that of Si and about three times as large as those of GaAs or sapphire substrates. Therefore, a $ZrB_2$ single crystal substrate 1 is suitable to dissipate heat from a nitride compound semiconductor device formed on the $ZrB_2$ single crystal substrate. On the other hand, a $TiB_2$ single crystal substrate has a lattice constant: a=3.030 Å which is somewhat smaller than that of a $ZrB_2$ single crystal substrate 1 but is well lattice matched with GaN and AlN. It should be noted further that $Zr_xTi_{x-1}B_2$ as a solid solution of $ZrB_2$ and $TiB_2$ can also be used to form a substrate for a nitride compound semiconductor.

Thus, in accordance with the present invention a (0001) faced $XB_2$ single crystal substrate 1 having a thickness of 0.1 mm or less is provided that permits stably obtaining a cleavage surface lying in (10-10) plane 4 that is congruent with (10-10) plane in which a cleavage surface of a nitride compound semiconductor lie. Moreover, such a XB2 single crystal substrate 1 has a low electrical resistivity and a high thermal conductivity and is therefore well suited as a substrate for a nitride compound semiconductor.

Mention is next made of a specific example of the $ZrB_2$ single crystal substrate according to the present invention.

Figure 4:
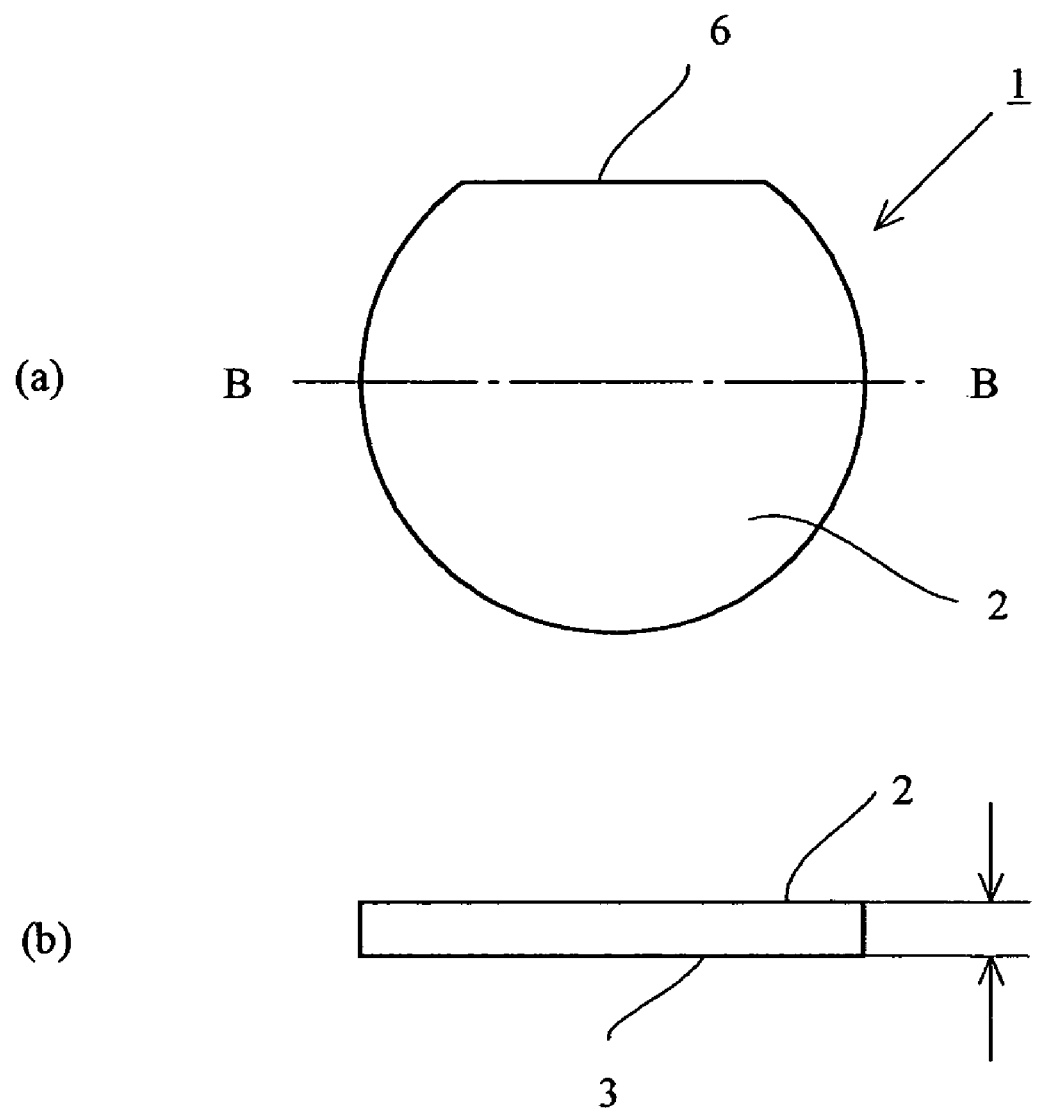
FIG. 4 has views illustrating a specific example of the $ZrB_2$ single crystal substrate according to the present invention.

FIG. 4 has views illustrating a specific example of the $ZrB_2$ single crystal substrate according to the present invention. FIG. 4(a) is a plan view of a round single crystal substrate of $ZrB_2$ that represents a substrate of the present invention. FIG. 4(b) is a cross sectional view taken along the line B-B. The round single crystal substrate of $ZrB_2$ shown in FIG. 4(a) has its main surface lying in a (0001) plane 2 as in FIG. 1. A (10-10) plane 4 or (11-20) plane to constitute the cleavage plane is indicated by an orientation flat 6. FIG. 4(b) shows a cross section that is identical to that shown in FIG. 1(b), and its repeated explanation is therefore omitted here.

An explanation is given below in respect of a method of making a $ZrB_2$ single crystal substrate as shown in FIG. 1.

A $ZrB_2$ powder on the market is molded and a resultant molding is baked at a temperature of 1,400° C. in vacuum to prepare a raw material bar of $ZrB_2$ crystal. Using a high-frequency floating zone (FZ) method, this raw material bar is single-crystallized. The high frequency FZ method is performed in an argon gas atmosphere in which a seed crystal is disposed at a lower end of the raw material bar to breed a single crystal along the bar from its lower end upwards. The $ZrB_2$ single crystal thus obtained is measured by an X-ray to check its crystal orientation and a (0001) faced plate is cut out. The $ZrB_2$ plate cut out has a thickness ranging from 0.4 mm to 0.55 mm and is then ground to have a thickness of 0.1 mm to 0.3 mm.

Subsequently, peripheral areas of the plate to constitute substrate side faces are measured of their crystal orientation and the plate is ground to shape those peripheral areas until the side faces each in line with a (10-10) 4 or (11-20) crystallographic plane are reached. The shaped plate is then further machined by polishing with colloidal silica to reduce its thickness to 0.06 to 0.1 mm. A $ZrB_2$ single crystal substrate 1 according to the present invention since if exceeding 0.1 mm in thickness it is hard to cleave stably should preferably be machined to a thickness of about 0.1 mm or less with a machining inconsistency taken into consideration.

Mention is next made of the cleavage of a $ZrB_2$ single crystal substrate of the present invention.

Referring again to FIG. 1, a $ZrB_2$ single crystal substrate 1 having a thickness of 0.06 mm is scribed on its front or rear face 2 or 3 with a scribe line 5 along a crystallographic (10-10) plane 4 using a diamond pen and then placed under a stress and cut with the scribe line 5 as a base line of cleavage.

Figure 5:
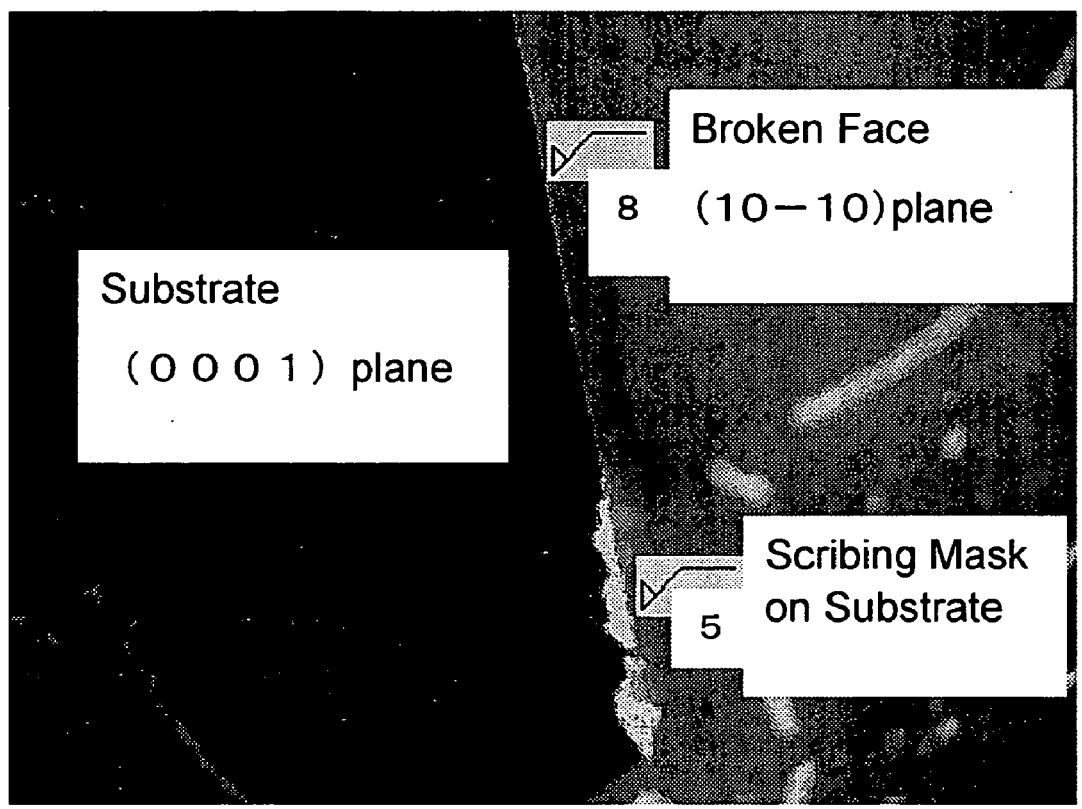
FIG. 5 is an enlarged photographic image taken when a cut area of a (0001) faced $ZrB_2$ single crystal substrate having a thickness of 0.06 mm cut parallel to a (10-10) plane is observed from obliquely above the substrate.

FIG. 5 is an enlarged photographic image taken when a cut area of a (0001) faced $ZrB_2$ single crystal substrate having a thickness of 0.06 mm cut parallel to a (10-10) plane is observed from obliquely above the substrate. In the Figure, a line, shown with the arrows, extending from mid the lower side of the photographic image towards the upper left corresponds to a nodal line 8 of a (0001) plane 2 and a (10-0) plane with a (10-11) plane 7. The scribing mark 5 made on $ZrB_2$ single crystal substrate is found at a lower part of the nodal line 8 indicated by an arrow. A cut section shown at the right hand side of the nodal line 8 is the (10-10) plane 4 that is shown retaining a favorable linearity to its nodal line 8 with the (0001) plane 2 in which the substrate surface lies.

Although to initiate cleaving or breaking in this method a scribe line is made on the substrate rear face over a full width defining a side of a cleavage or break area to be produced, such a scribe line may be only a part of the width, made with 2 to 3 mm long, on the substrate rear or front surface 3 or 2 so that under a stress subsequently applied to this scribe line, breakage propagates spontaneously to an area not scribed in a (10-10) plane. Thus, scribing with a diamond pen followed by stressing allows cutting while retaining a favorable linearity to the nodal line 8 with respect to the (0001) plane 2 of the substrate surface.

Figure 6:
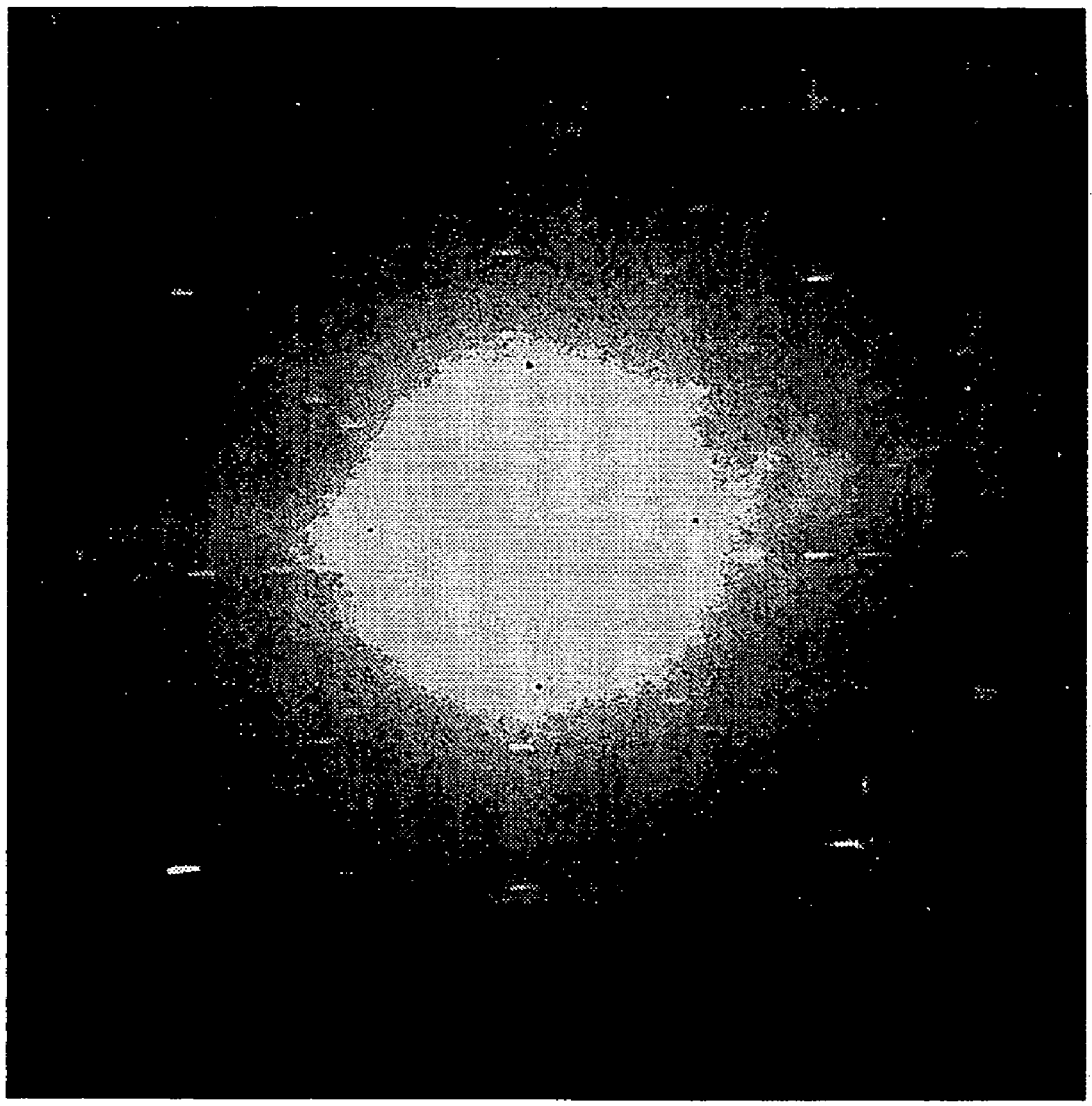
FIG. 6 is a Laue photograph by an X-ray of a cut face favorably obtained for the back surface of a single crystal substrate having a thickness of 0.1 mm or less.

FIG. 6 is a Laue photograph by an X-ray of a cut face favorably obtained for the back surface of a $ZrB_2$ single crystal substrate having a thickness of 0.1 mm or less. The pattern of Laue spots by X-ray shown there indicates that the cut face consists of a (10-10) plane 4 rather than a (10-11) plane 7 as an instinct cleave plane of the $ZrB_2$ single crystal substrate 1.

Mention is further made of a specific example of the mechanical cutting of a $ZrB_2$ single crystal substrate of the present invention.

This is an example that a $ZrB_2$ single crystal substrate of the present invention is cut and thereby cleaved using a dicer having a diamond blade generally used in splitting a device.

Figure 7:
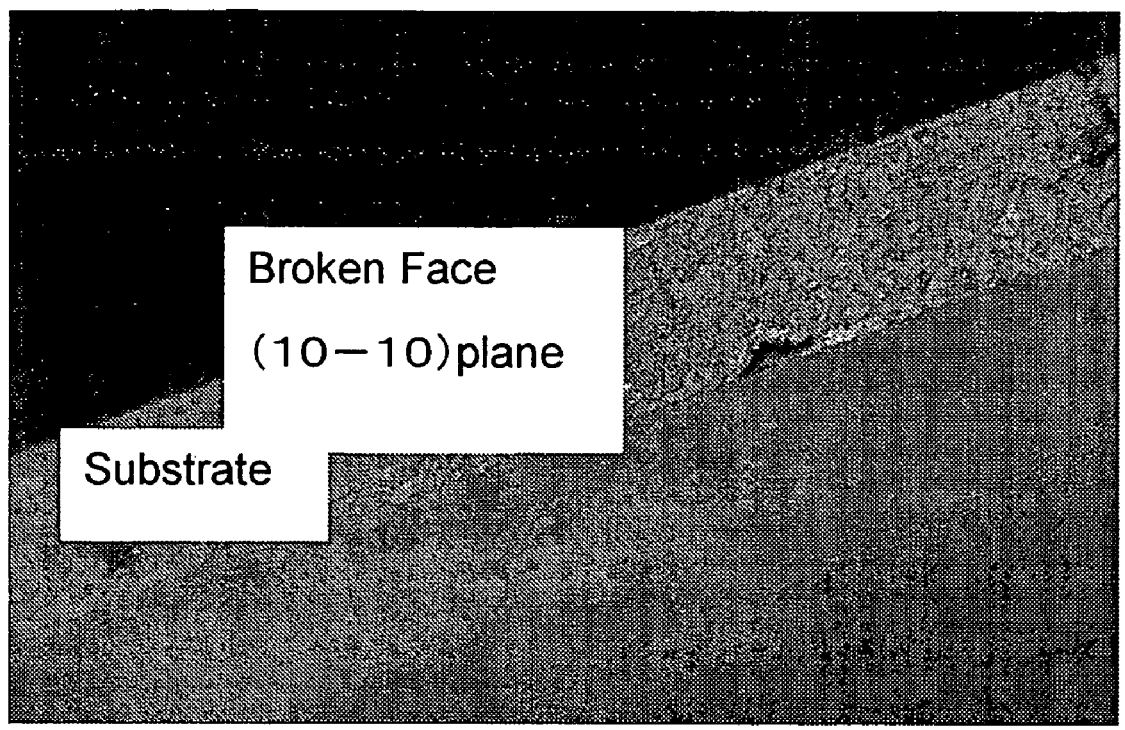
FIG. 7 is an enlarged photographic image of a cut area resulting from cutting a (0001) faced $ZrB_2$ single crystal substrate of 0.06 mm thick along a (10-10) crystallographic plane using a dicer.

Using such a dicer the $ZrB_2$ single crystal substrate 1 of 0.06 mm thick in a shape as shown in FIG. 1 was cut from its (0001) crystallographic face 2 along a (10-10) crystallographic plane 4. FIG. 7 is an enlarged photographic image of a cut area resulting from cutting a (0001) faced $ZrB_2$ single crystal substrate 1 of 0.06 mm thick along a (10-10) crystallographic plane using a dicer. As shown, the (10-10) cut face 4 exhibits a fine breaking surface like ground glass as can be clearly distinguished from a cut surface by scribing.

Mention is next made of a comparative example in which a $ZrB_2$ single crystal substrate large in thickness is likewise broken.

Figure 8:
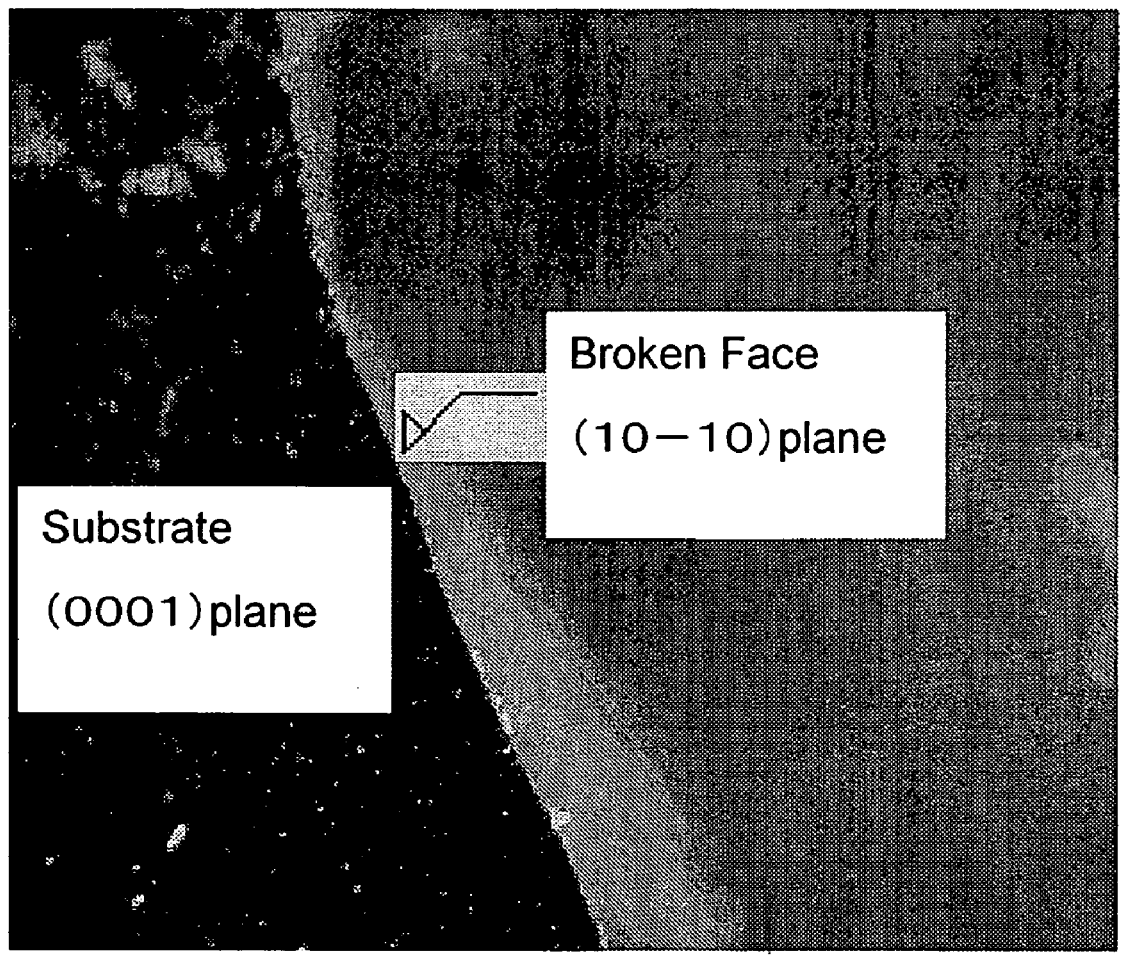
FIG. 8 is a photographic image of a broken area resulting from breaking a (0001) faced $ZrB_2$ single crystal substrate of 0.33 mm thick along a (10-10) crystallographic plane, the image being taken from obliquely above the substrate.

A (0001) faced $ZrB_2$ single crystal substrate of 0.33 mm thick is scribed on its front or rear surface in a length of 2 to 3 mm from a side thereof along a (10-10) crystallographic plane, followed by stressing the scribe line. FIG. 8 is a photographic image of a broken area resulting from breaking the (0001) faced $ZrB_2$ single crystal substrate of 0.33 mm thick along the (10-10) crystallographic plane, the image being taken from obliquely above the substrate. With the substrate being as thick as 0.33 mm, it is seen that the broken face is bent and no breakage occurs that retains the linearity along the (10-10) plane 4.

Figure 9:
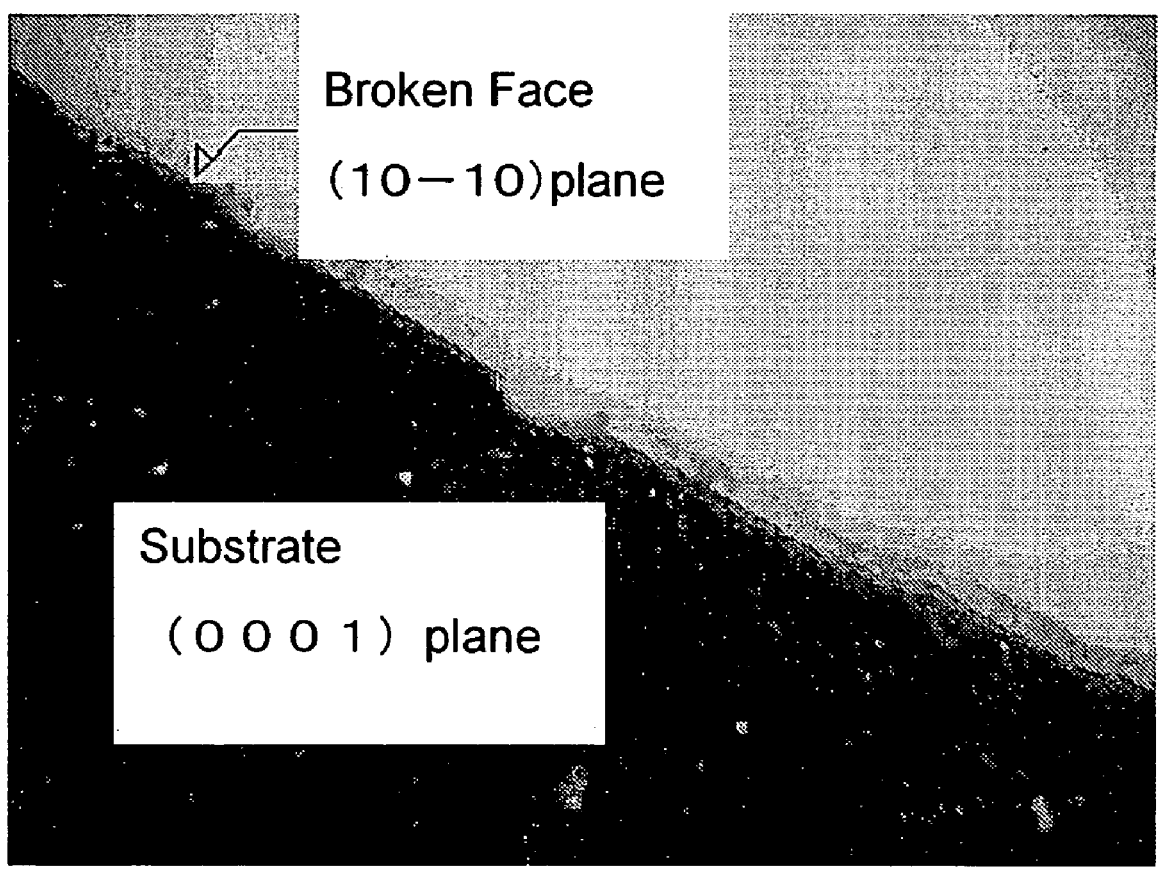
FIG. 9 is a photographic image taken in a comparative example of a broken or cleavage surface resulting from breaking a (0001) faced $ZrB_2$ single crystal substrate of 0.33 mm thick on which to initiate breaking a scribe line has been made on a rear surface thereof over a full width defining a side of the cleavage or break area to be produced, the image being taken from obliquely above the substrate.

FIG. 9 is a photographic image taken in a comparative example of a broken or cleavage surface resulting from breaking a (0001) faced $ZrB_2$ single crystal substrate of 0.33 mm thick on which to initiate breaking a scribe line has been made on a rear surface thereof over a full width defining a side of the cleavage or break area to be produced, the image being taken from obliquely above the substrate. Even if the substrate is thick, it is seen that with a rear surface scribed on its rear surface over a full width of cleavage, it is then possible to produce a breakage or cleavage face that matters little in splitting a semiconductor device depending on its type of device even though it is not suitable for use in forming a resonator in a semiconductor laser diode.

Mention is next made of a second form of implementation of the present invention as a semiconductor laser diode (LD) using a substrate according to the invention.

Figure 10:
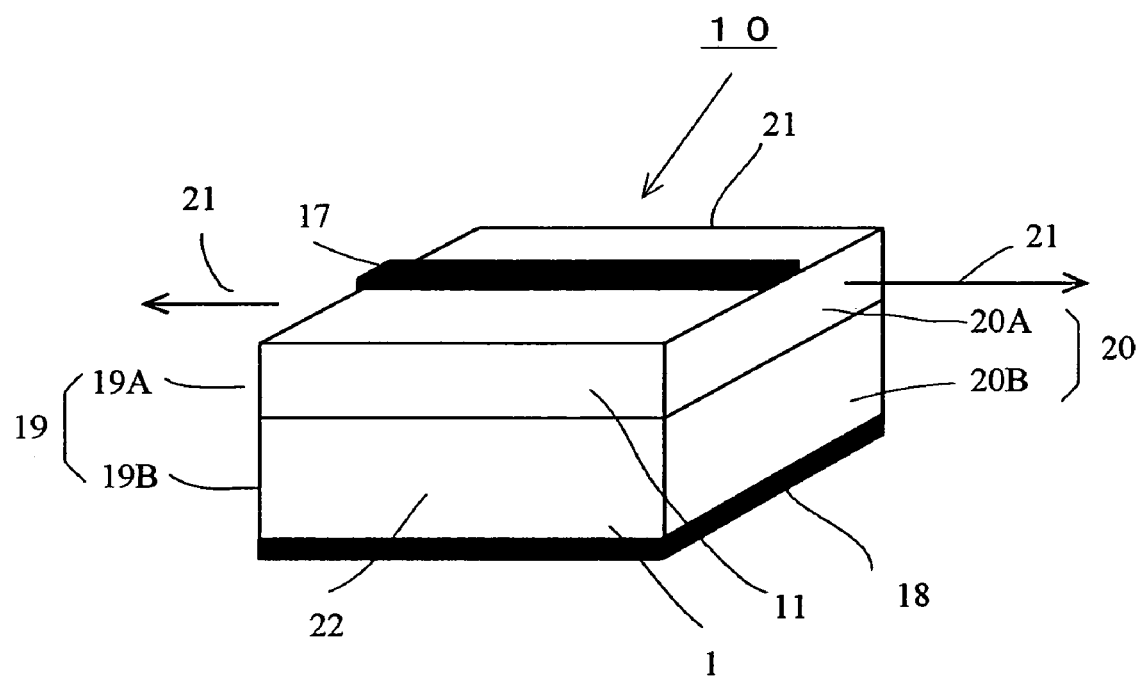
FIG. 10 is a perspective view illustrating the structure of a LD that represents the second form of the present invention.
Figure 11:
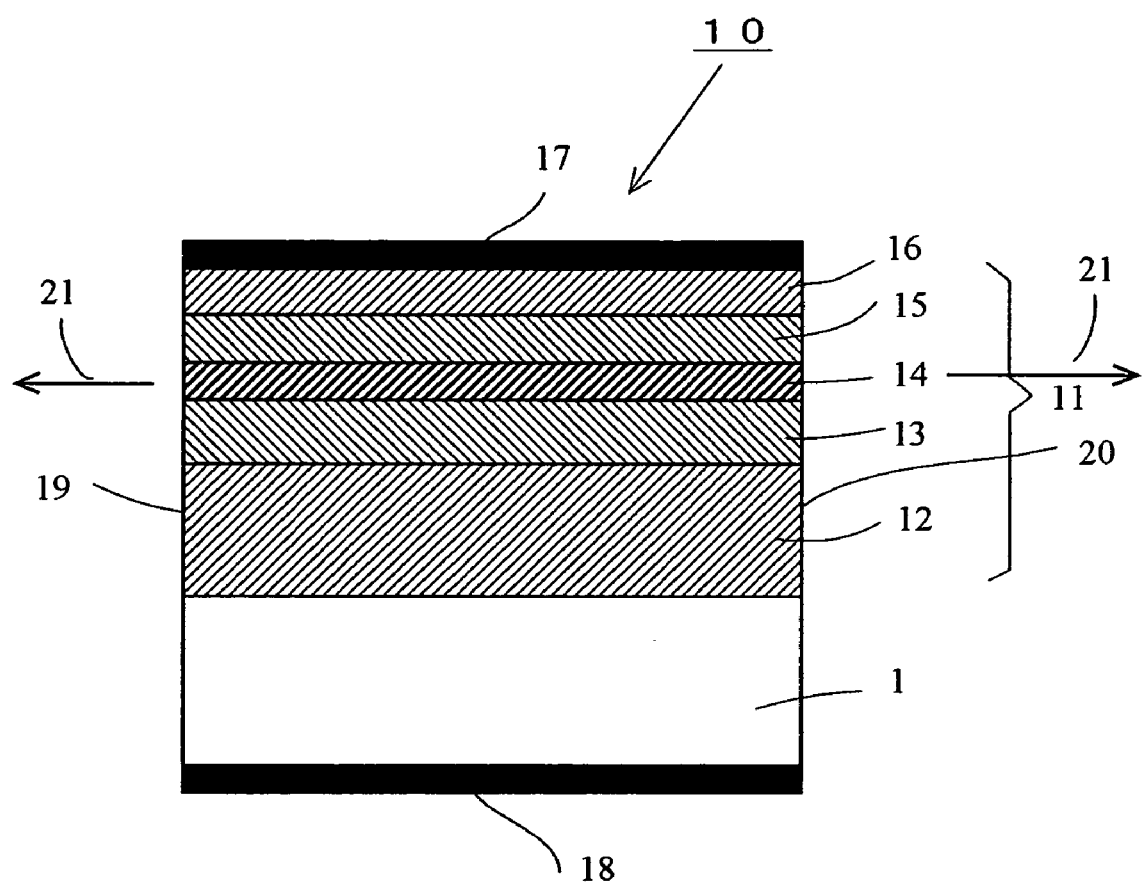
FIG. 11 is a cross sectional view of the LD structure of the present invention taken in the direction of an optical path.

FIG. 10 is a perspective view illustrating the structure of a LD that represents the second form of the present invention and FIG. 11 is a cross sectional view of the LD structure of FIG. 10 taken in the direction of an optical path. A LD 10 according to the present invention has a LD structure 11 formed on a $ZrB_2$ single crystal substrate 1 that is facially oriented in a (0001) plane. The LD structure 11 is provided in its uppermost part with a stripe electrode 17 and on a rear surface of the $ZrB_2$ substrate 1 with a counter electrode 18. The $ZrB_2$ substrate 1 has a thickness preferably of 0.1 mm or less. The structure has opposed end faces 19 (19A, 19B) and 20 (20A, 20B) formed by cleaving perpendicular to the optical path indicated by reference character 21.

Here, a first pair of opposed end faces 19A and 20A constitute a Fabry-Perot resonator of the LD structure 11 made of a nitride compound semiconductor and lie each in a (10-10) plane 4, and a second pair of opposed end faces 19B and 20B are as of the $ZrB_2$ single crystal substrate 1 and lie in the same (10-10) planes 4, respectively.

The LD structure 11 comprises multiple active layers of the nitride compound semiconductor, which are successively formed as an n-type ($n^+$) low resistance GaN layer 12, an n-type $Al_{0.1}Ga_{0.9}N$ layer 13, a $Ga_{0.9}In_{0.1}N$ active later 14, a p-type $Al_{0.1}Ga_{0.9}N$ layer 15 and a p-type ($p^+$) low resistance GaN layer 16, on the $ZrB_2$ single crystal substrate 1. So that any depletion layer is not formed in the interface between the $n^+$ GaN layer 12 and the $ZrB_2$ single crystal substrate 1, it is desirable that a high concentration Si as impurity should be doped as high as possible into the $n^+$ GaN layer 12. Further, the electrodes 17 and 18 are provided as an ohmic electrode to a p layer on the p-type ($p^+$) GaN layer 16 as the uppermost active layer 11 and as an ohmic electrode to an n layer on the rear surface of the $ZrB_2$ substrate 1, respectively.

Here, use may be made of $Al_xGa_yIn_zN$ (where x+y+z=1) as the multiple layers of the nitride compound semiconductor that constitutes the LD structure 11. Further, while the LD structure 11 here illustrated is a so-called double hetero structure, use may also be made of a quantum well or multiple quantum well structure.

Mention is made of features of the LD constructed as mentioned above as the second form of implementation of the present invention. Being identical to that as a cleavage plane of the $ZrB_2$ single crystal substrate 1 having a thickness of 0.1 mm or less, a (10-10) plane as a cleavage plane of a nitride compound semiconductor constituting an end face of the Fabry-Perot resonator can not only be cleaved easily but also be obtained as a mirror surface high in planarity. Thus, compared with those of the LD 40 with a nitride compound semiconductor using a sapphire substrate according to the first prior art, there can be obtained here well reproducibly cleavage faces 19A and 20A being mirror surfaces extremely high in planarity, highly suitable to form end faces of the Fabry-Perot resonator. This permits reducing the loss, while improving the Q value, of the Fabry-Perot resonator for the LD 10 and lowering the threshold current for lasing the LD 10. Further, in contrast to the LD 40 with a nitride compound semiconductor using the sapphire substrate 41 according to the first prior art, the LD 10 of the present invention permits forming an ohmic electrode 18 to an n layer on the rear surface of a $ZrB_2$ single crystal substrate 1 being electrically conductive. This in turn permits the LD 10 of the present invention to be realized in a vertical structure as same as that with III-V group compound semiconductor.

The LD 10 which according to the present invention can be realized by a vertical structure using nitride compound semiconductor eliminates the need to form an n-layer electrode 48B on a device as in the LD in the first prior art. This in turn makes unnecessary any step as required to expose the n$^+$GaN layer 43 on the device and significantly reduces the total processing time period, thereby reducing the cost of manufacture while improving the yield of products. Also, with a ZrB$_2$ single crystal substrate 1 being larger in thermal conductivity than a sapphire substrate 41, a LD 10 according to the present invention much excels in heat dissipation. This allows the LD 10 of the present invention to produce the same output power of LD 40 at a junction temperature lower than that at which the LD 40 in the first prior art. Thus, the LD 10 can be continuously operated longer and have an extended lifetime over the LD 40 with a marked increase in operating reliability.

Figure 12:
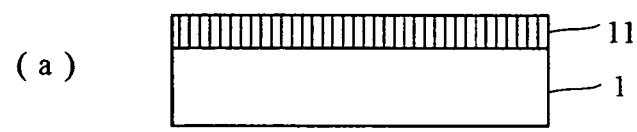
FIG. 12 is a chart illustrating a method of manufacture of a semiconductor laser diode that represents a third form of implementation of the present invention.
Figure 12:
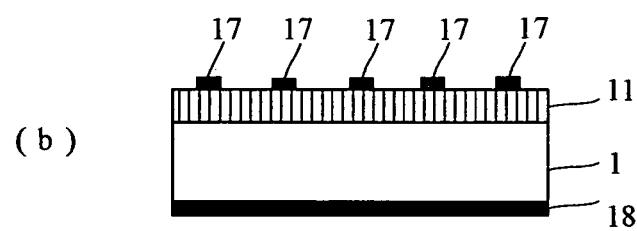
Figure 12:
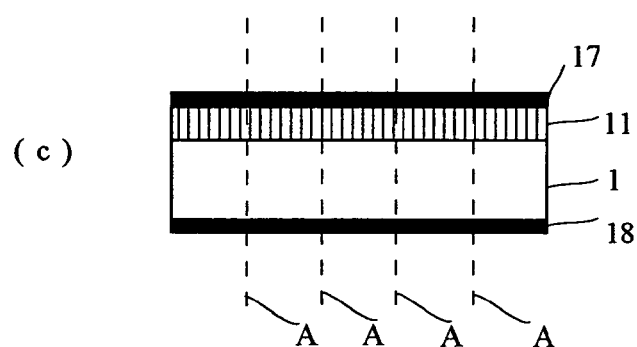
Figure 12:
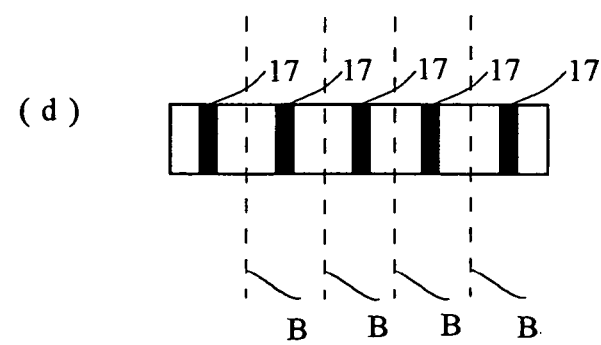
Figure 12:
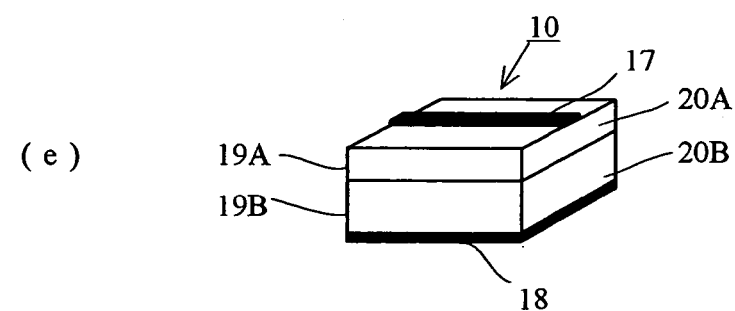

Referring next to FIG. 12, mention is made of the manufacture of a LD using a substrate of the present invention as a third form of implementation thereof. As shown in FIG. 12(a), a LD active layer 11 of a nitride compound semiconductor is first formed using a CVD (MOCVD) or molecular beam epitaxial (MBE) method using organometallic compounds on a ZrB$_2$ single crystal substrate 1 that is facially oriented in a (0001) plane 2 by crystallographically growing an n$^+$ GaN layer 12, an n-type Al$_{0.1}$Ga$_{0.9}$N layer 13, a Ga$_{0.9}$In$_{0.1}$N active later 14, a p-type Al$_{0.1}$Ga$_{0.9}$N layer 15 and a p-type p$^+$ GaN layer 16 successively on the substrate 1. The ZrB$_2$ single crystal substrate 1 may be rectangular in shape as shown in FIG. 1 or alternatively in the form of a round disk as shown in FIG. 2. ZrB$_2$ and a nitride compound semiconductor being equally hexagonal crystallographically, the nitride compound semiconductor here is grown epitaxially with a crystal orientation congruous with that of ZrB$_2$ in each of (0001), (10-10) and (11-20) directions.

Subsequently, as shown in FIG. 12(b), the uppermost p$^+$ GaN layer 16 in the LD active layer 11 is formed thereon by sputtering or electron beam vapor depo2sition with metallic layers which are heat treated to form ohmic electrodes 17. Alternatively, the LD active layer 11 epitaxially grown may upon masking be formed with an insulator such as SiO$_2$ by CVD while windowed regions in the form of stripes such that they form ohmic electrodes 17.

As shown in FIG. 12(c), the ZrB$_2$ single crystal substrate 1 when generally 0.1 mm or less in thickness is formed on its rear surface by sputtering or electron beam vapor deposition with a metallic layer which is heat treated to from an ohmic electrode 18 to the n layer. On the other hand, when the ZrB$_2$ single crystal substrate 1 has a thickness of, say, 0.3 mm, then the substrate can be polished to reduce its thickness to 0.1 mm or less and thereafter the ohmic electrode 18 may be formed thereon.

After the ZrB$_2$ single crystal substrate 1 and the LD active layer 11 are processed as mentioned above, the ZrB$_2$ single crystal substrate 1 is scribed or scribed by point on its rear surface in a direction perpendicular to the direction in which the optical path extends and cut by cleaving along broken lines A so that each of cut faces lies in a (10-10) crystallographic plane 4 of the ZrB$_2$ single crystal.

As shown in FIG. 12(d), each resultant ZrB$_2$ substrate 1 is separated by a cutter with a diamond blade along (11-20) crystallographic planes of ZrB$_2$ indicated by broken lines B into a plurality of such substrates. As shown in FIG. 12(e), each of opposed end faces 19a and 20A lies in a (10-10) crystallographic planes where the nitrogen compound semiconductor was cleaved and each of opposed end faces 19B and 20B lies in a (10-10) crystallographic plane 4 of ZrB$_2$ forming the substrate 31.

Dividing a ZrB$_2$ single crystal substrate 1 whose principal surface lies in a (0001) plane 2 so that it is split parallel to a (10-10) crystallographic plane 4 allows the opposed end faces 19A and 20A of the multiple layers of a nitrogen compound semiconductor forming a LD active layer 11 to be each a surface that is smooth and high in planarity. This permits a LD 10 formed on the ZrB$_2$ single crystal substrate 1 to form between such opposed end faces 19A and 20A a Fabry-Perot resonator that is small in loss and thus to have an improved oscillation efficiency.

Figure 13:
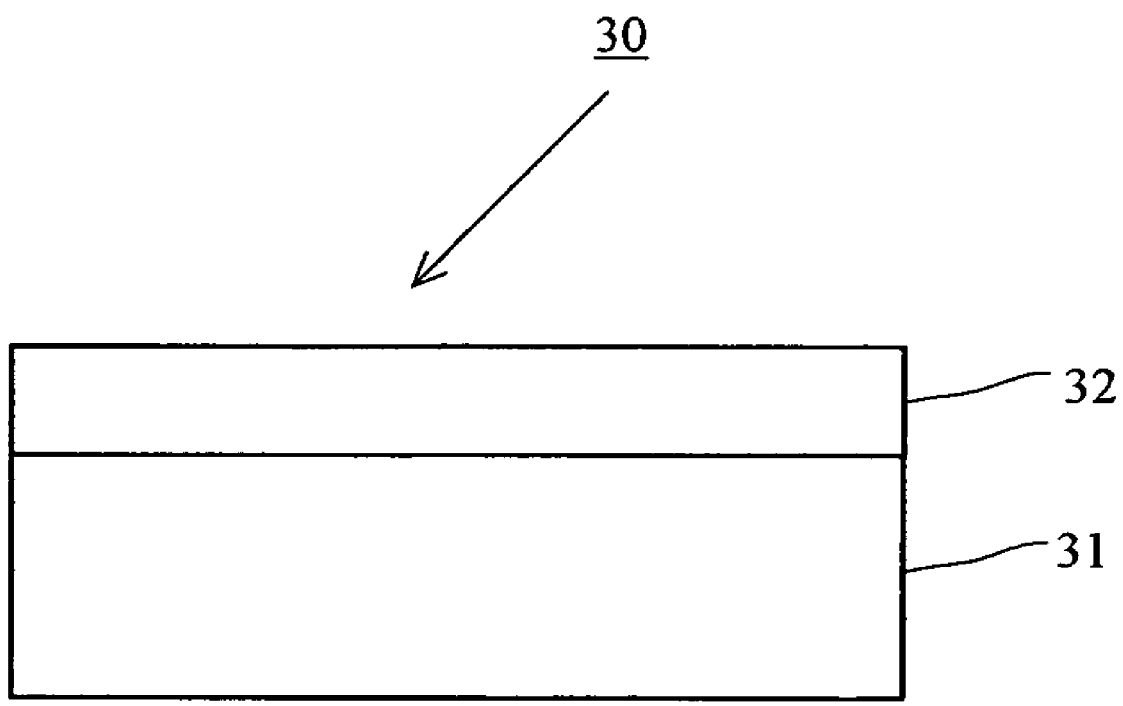
FIG. 13 is a cross sectional view illustrating the structure of a semiconductor device as a fourth form of implementation of the present invention.

Mention is next made of a semiconductor device using the substrate of the present invention as a fourth form of implementation thereof. FIG. 13 is a cross sectional view illustrating the structure of a semiconductor device as a fourth form of implementation of the present invention. The semiconductor device of the invention denoted by reference character 30 is formed with a device structure 32 on a ZrB$_2$ single crystal substrate 31 that is facially oriented in a (0001) crystallographic plane 2. The device structure 32 may here be composed of a nitrogen compound semiconductor containing at least one of Al, Ga and In (such as Al$_x$Ga$_y$In$_z$N where x+y+z=1) to constitute a semiconductor device such as a LED, a photodetector, a heterojunction bipolar transistor (HBT) or a field effect transistor (FET) or an integrated circuit with such semiconductor devices.

The ZrB$_2$ single crystal substrate 31 to carry such a semiconductor as LED, photodetector, HBT or FET where the absence of a precise breaking line as shown in FIG. 9 does not much matter in the separation of devices even though there is some corrugation may be as thick as 0.3 mm sufficient to successfully split itself parallel to a (10-10) plane 4 into devices. In case of, for example, HBT or FET for a power transistor of operating frequency over microwave band, the thickness of a ZrB$_2$ single crystal substrate 31 is preferably 0.1 mm or less for with heat dissipation taken into consideration.

Figure 14:
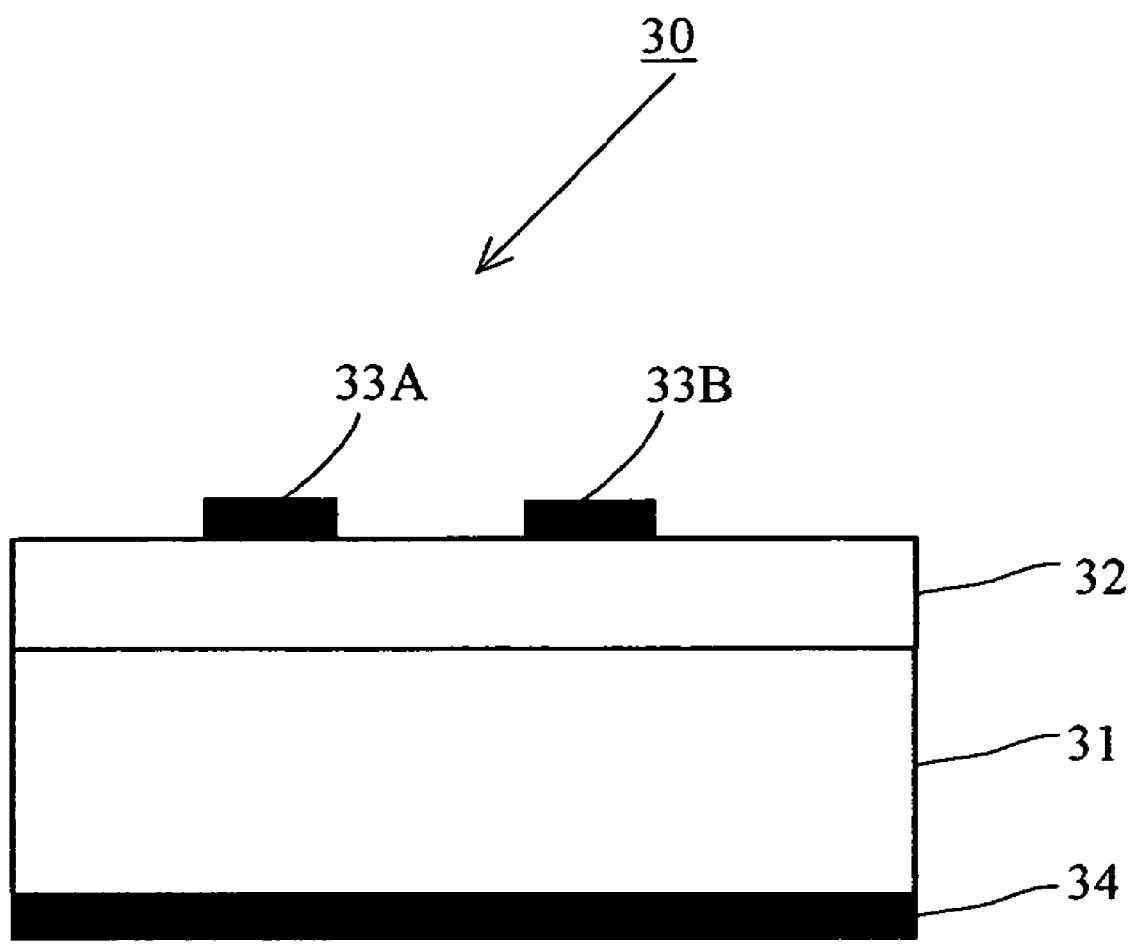
FIG. 14 is a cross sectional view illustrating the structure of a HBT as the fourth form of implementation of the present invention.

FIG. 14 is a cross sectional view illustrating the structure of a HBT as the fourth form of implementation of the present invention. As shown, the device structure 32 has on its front surface an emitter and a base electrode 33A and 33B while the ZrB$_2$ single crystal substrate 3 has on its rear surface a collector electrode 34. In a HBT of the present invention, a collector electrode can be formed on the rear surface of a ZrB$_2$ single crystal substrate 31 that is electrically conductive. Thus, in accordance with the present invention, it is seen that a HBT of the vertical structure that cannot be taken by a HBT using a sapphire substrate as in the first prior art can easily be realized.

Figure 15:
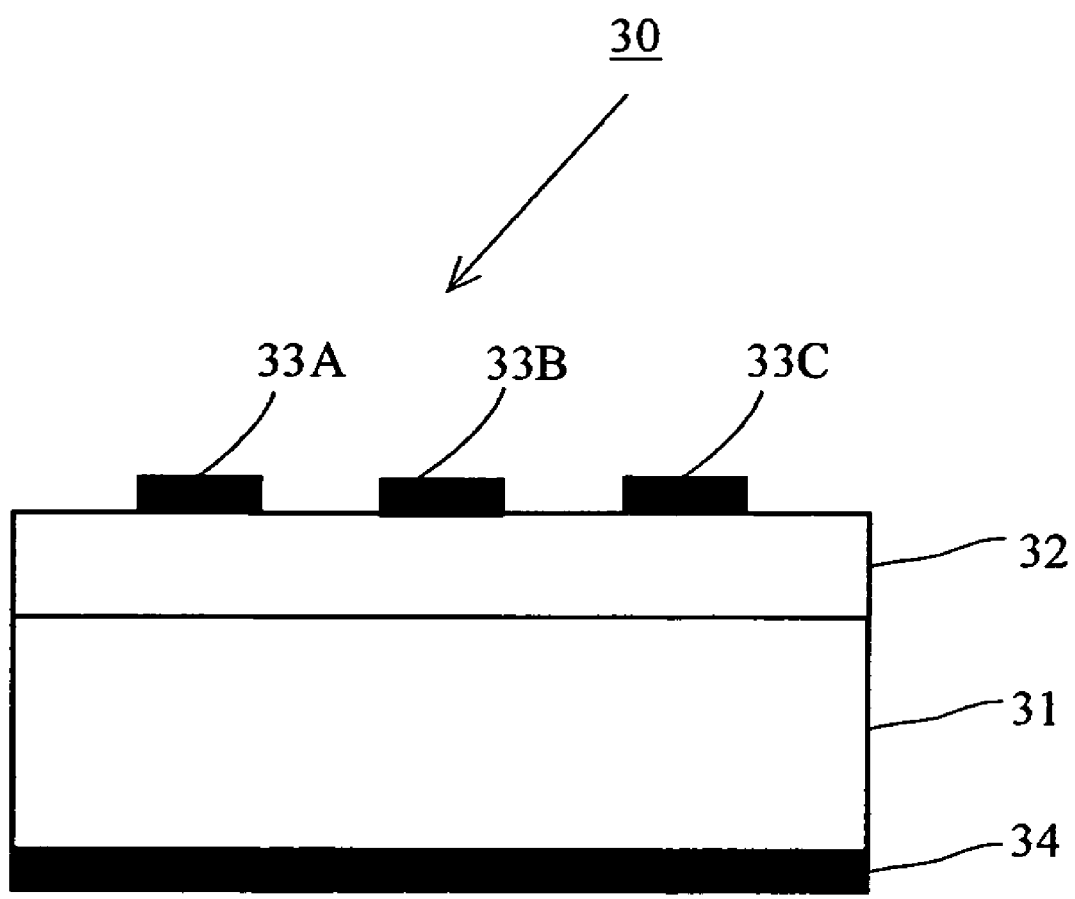
FIG. 15 is a cross sectional view illustrating the structure of a FET as the fourth form of implementation of the present invention.

FIG. 15 is a cross sectional view illustrating the structure of a FET as the fourth form of implementation of the present invention. As shown, the device structure 32 has on its front surface a source, a gate and a drain electrodes 33A, 33B and 33C which correspond to an emitter, a base and a collector electrodes in HBT. And, the substrate has on its rear surface an electrode 34 that can be grounded to serve as a ground electrode. The source or gate electrode 33A or 33B can be connected to the substrate electrode through, e.g., a via hole. This permits markedly decreasing the parasitic inductance in the source or gate. Thus, in accordance with a FET of the present invention, it is seen that since the ZrB$_2$ single crystal substrate can be grounded, it is possible to decrease the parasitic resistance markedly and thereby to increase its operating frequency easily. Further, since heat is well dissipated from the substrate, it is possible to improve its output power and efficiency.

Figure 16:
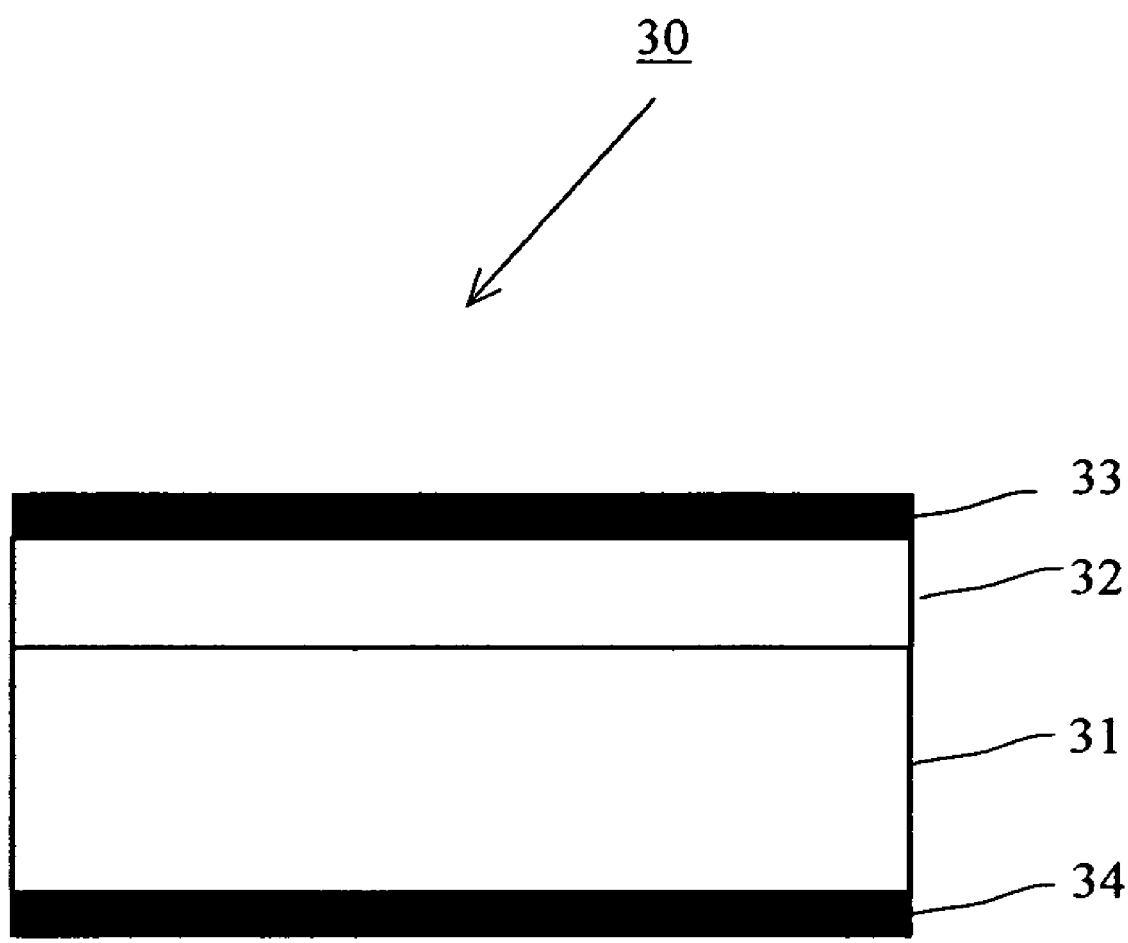
FIG. 16 is a cross sectional view illustrating the structure of a diode as the fourth form of implementation of the present invention.

FIG. 16 is a cross sectional view illustrating the structure of a diode as the fourth form of implementation of the present invention. As shown, the device structure 32 has an anode 33 on its front surface and the ZrB$_2$ substrate 31 has on its rear surface a cathode 34. The anode and the cathode can be interchanged. Here, such diode preferably may be a LED, a pin photodiode or an avalanche diode as a photodetector, or a varactor diode.

Here, the electrode 34 on the substrate rear surface being an anode or cathode, a diode of the vertical structure that cannot be taken by a diode with a sapphire substrate of the first prior art can easily be realized. Thus, in accordance with the present invention, it is seen that using a ZrB$_2$ substrate for a nitride compound semiconductor, a diode of the vertical structure formed with an electrode on the substrate side can be made with ease and at low cost.

Mention is made of features of a semiconductor device according to the fourth form of implementation of the present invention. In contrast to a nitride compound semiconductor device using a sapphire substrate as in the first prior art, an ohmic electrode can be formed on the rear surface of a substrate that is here made of an electroconductive ZrB$_2$ single crystal 31. This permits the semiconductor device 30 of the present invention to be easily realized in the form of a LED or HBT having a vertical structure with III-V group compound semiconductor.

A semiconductor device 30, such as a LED or HBT, of the present invention that can be realized in a vertical structure with a nitrogen compound semiconductor eliminates the need to form an anode or cathode electrode on the substrate of a LED or a drain electrode of a HBT on the top of the device. This in the manufacture of a semiconductor device 30 such as a LED or HBT makes it unnecessary to carry out a step for exposing each of all the electrodes on a top of the device. This in turn significantly reduces the total processing time period and materially improves the yield of such devices in their manufacture.

Also, with a ZrB$_2$ single crystal substrate 31 having a larger thermal conductivity than that of a sapphire substrate 41, a semiconductor device 30 according to the present invention much excels in heat dissipation. Since this allows the semiconductor device 30 of the present invention to operate at a temperature lower than that at which a semiconductor device as in the first prior art can operate, a HBT or FET can be operated with a marked increase in output power, efficiency and reliability.

Figure 17:
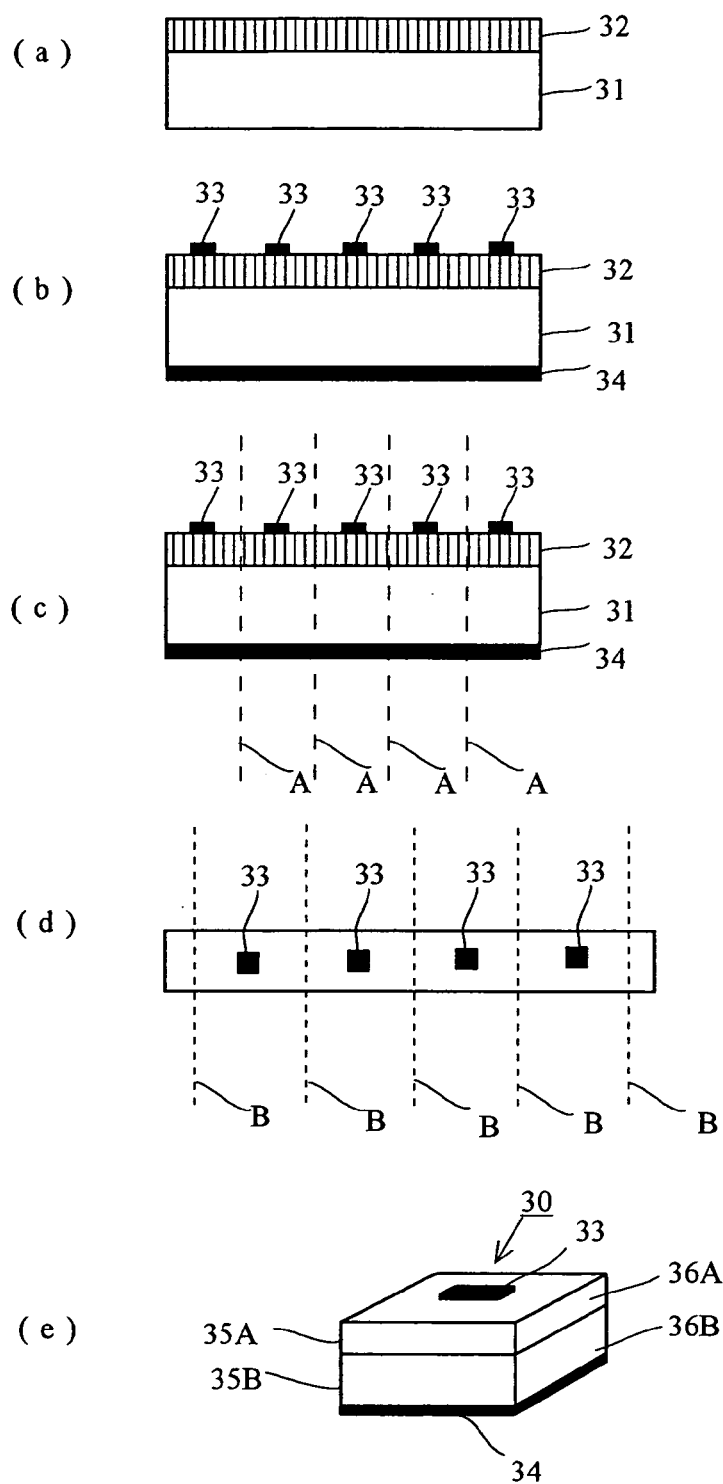
FIG. 17 is a chart illustrating a method of manufacture of a semiconductor device that represents a fifth form of implementation of the present invention.

Mention is next made of a method of making a semiconductor device using a substrate of the present invention as a fifth form of implementation thereof. FIG. 17 is a chart illustrating such a method of manufacture of a semiconductor device that represents the fifth form of implementation of the present invention. As shown in FIG. 17(a), first a ZrB$_2$ single crystal substrate 31 that is facially oriented in a (0001) plane 2 is formed by a CVD (MOCVD) or molecular beam epitaxial (MBE) method using organometallic compounds with an epitaxial layer to constitute the semiconductor device structure 32 made of a nitride compound semiconductor (Al$_x$Ga$_y$In$_z$N where x+y+z=1). The ZrB$_2$ single crystal substrate 1 may be rectangular in shape as shown in FIG. 1 or alternatively in the form of a round disk as shown in FIG. 2. Subsequently, as shown FIG. 17(b) the device structure 32 after having been processed in a given manner such as for forming electrodes is formed thereon by sputtering or electron beam vapor deposition with metallic layers which are heat treated to form these ohmic electrodes as indicated by reference character 33. Alternatively, the device structure 32 epitaxially grown may upon masking be formed, thought not shown, with an insulator such as SiO$_2$ by CVD while leaving unmasked or windowed regions in the form of stripes such that they form ohmic electrodes 33.

As shown in FIG. 17(c), the ZrB$_2$ single crystal substrate 1 if generally 0.1 mm or less in thickness is formed on its rear surface by sputtering or electron beam vapor deposition with a metallic layer which is heat treated to form an ohmic electrode 34. On the other hand, if the ZrB$_2$ single crystal substrate 1 has a thickness of, say, 0.3 mm, then the substrate can be polished to reduce its thickness to 0.1 mm or less and thereafter the ohmic electrode 34 may be formed thereon. The ZrB$_2$ single crystal substrate 1 and the device structure 32 having been processed as mentioned above are cut by cleaving along broken lines A using a rapidly rotating dicer with a diamond blade. Then, each of cut faces preferably lies in a (11-20) plane that is perpendicular to a (10-10) crystallographic plane 4. When two or more devices if formed on a single substrate are separated, they are at least once separated parallel to a (10-10) plane 4. If the devices are each square or rectangular, they are separated so that each has a pair of opposed sides that are parallel to the (10-10) plane 4 and the other pair of opposed sides that are parallel to the (11-20) plane as orthogonal thereto.

As shown in FIG. 17(d), each resultant body is cut by cleaving along (10-10) crystallographic planes 4 of ZrB$_2$ indicated by broken lines B into a plurality of such bodies, each individually forming a semiconductor device 30 according to the present invention as shown in FIG. 17(e). In each body as shown in FIG. 17(e) the device structure of nitride compound semiconductor has a pair of (10-10) faces 35A and 36A while the substrate 31 has a pair of (10-10) faces 4 indicated by 35B and 36B. Separation parallel to a (10-10) plane 4 preferably uses scribing with a scriber such as a diamond pen, followed by stressing for splitting with ease, without necessitating any cutting margin.

Figure 18:
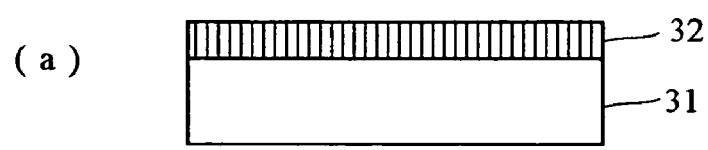
FIG. 18 is a chart illustrating a method of manufacture of a LED as the fifth form of implementation of the present invention.
Figure 18:
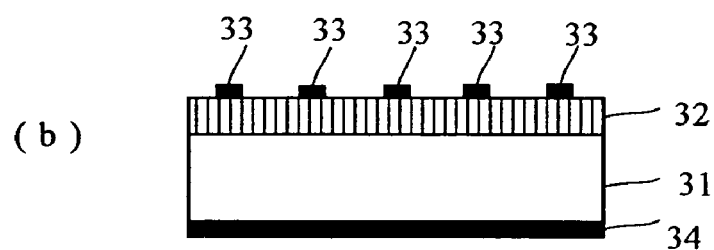
Figure 18:
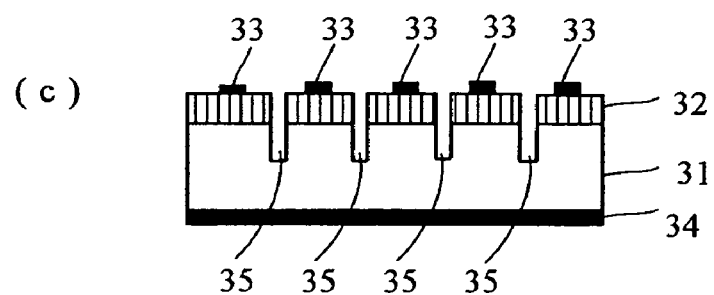
Figure 18:
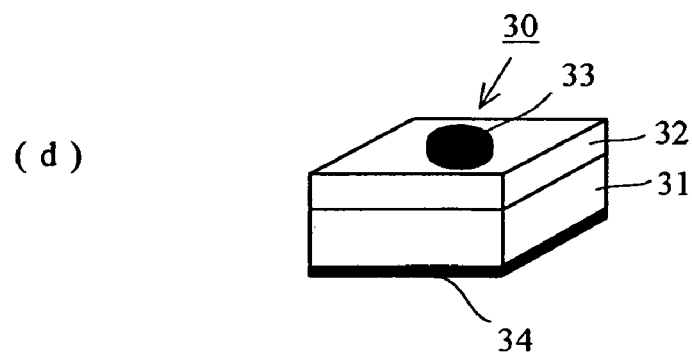
Figure 19:
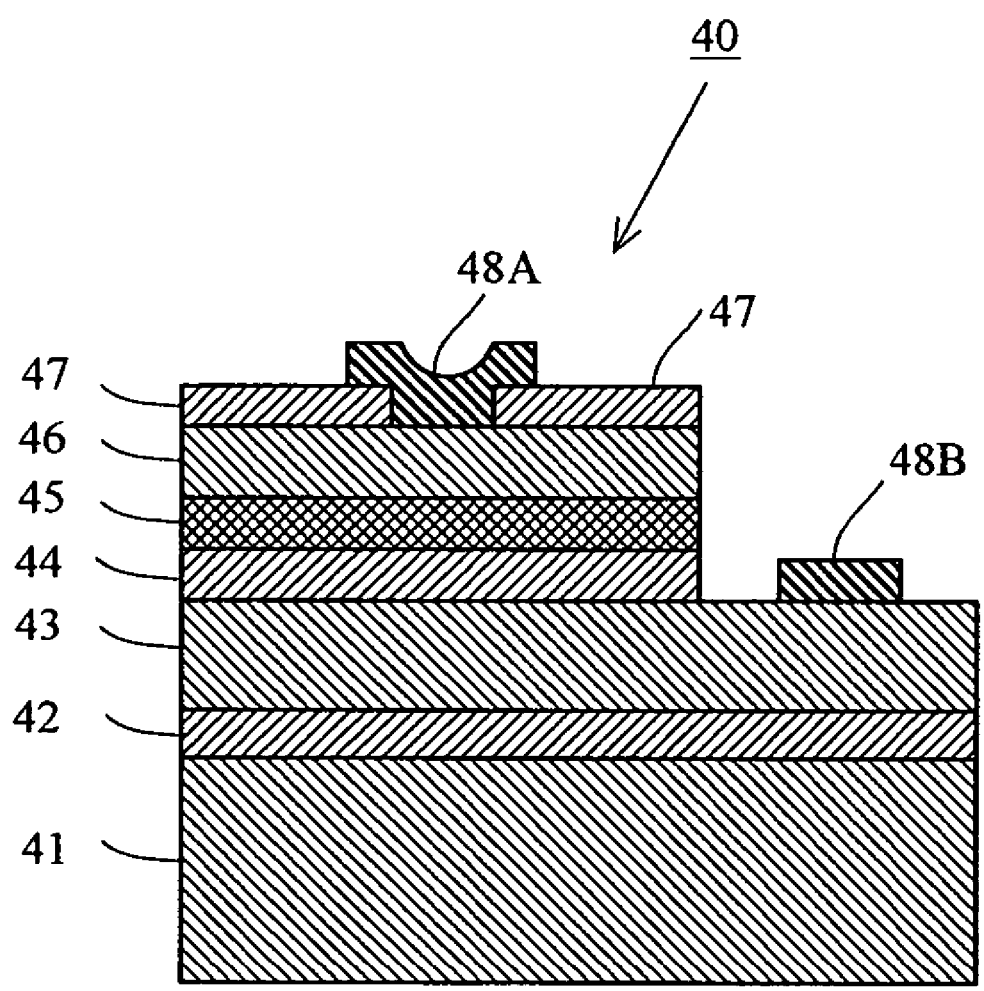
FIG. 19 is a perspective view illustrating an exemplary LD with a nitride compound semiconductor using a sapphire substrate according to the prior art.

Another example of the fifth form of implementation as a method of making a semiconductor device using a substrate according to the present invention is given below. FIG. 18 is a chart illustrating a method of manufacture of a LED as the fifth form of implementation of the present invention. As shown in FIG. 18(a), first a ZrB$_2$ single crystal substrate 31 that is facially oriented in a (0001) plane 2 is formed by a CVD (MOCVD) method using an organometallic compound with an epitaxial layer to constitute a LED device structure 32 made of a nitride compound semiconductor (Al$_x$Ga$_y$In$_z$N where x+y+z=1). The ZrB$_2$ single crystal substrate 1 may be rectangular in shape as shown in FIG. 1 or alternatively in the form of a round disk as shown in FIG. 4. The ZrB$_2$ single crystal substrate 1 may be 0.3 to 0.35 mm in thickness.

Subsequently, as shown in FIG. 18(b) the device structure 32 after having been processed in a given manner is formed thereon by sputtering or electron beam vapor deposition with metallic layers which are heat treated to form ohmic electrodes 33. Alternatively, the device structure 32 epitaxially grown may upon masking be formed, thought not shown, with an insulator such as SiO$_2$ by CVD while leaving unmasked or windowed regions in the form of stripes such that they form ohmic electrodes 33.

Subsequently, as the ZrB$_2$ single crystal substrate 1 is formed on its rear surface by sputtering or electron beam vapor deposition with a metallic layer which is heat treated to from an ohmic electrode 34. Subsequently, the LED structure 32 is cut from its front side into dice using a rapidly rotating dicer with a diamond blade at regions of cut 35 with a depth of cut ranging around, e.g., 0.2 to 0.25 mm. Then, cut faces preferably lie in (11-20) planes and (10-10) planes 4 perpendicular thereto. When two or more devices if formed on a single substrate are separated, they are at least once separated parallel to a (10-10) plane 4.

If the devices are each square or rectangular, they are separated so that each has a pair of opposed sides that are parallel to the (10-10) plane 4 and the other pair of opposed sides that are parallel to the (11-20) plane as orthogonal thereto. After cutting, a LED structure 32 of nitride compound semiconductor may have mesa etching.

Finally, the structure is cleaved along the regions of cut and thereby split into a plurality of divisions each individually forming a LED product as shown in a perspective view in FIG. 18(*d*). In this case, when the LED does not necessarily require a breaking face to be extremely high in linearity, the substrate needs not be 0.1 mm or less in thickness.

The method of making a LED according to the present invention makes it possible for the LED of a vertical structure with a nitride compound semiconductor using a $ZrB_2$ single crystal substrate to be produced easily. Moreover, this method of manufacture makes it possible for a LED of the vertical structure that cannot be taken as in the first prior art using a sapphire substrate to be produced in a reduced number of steps of manufacture.

Although the present invention has hereinbefore been set forth with respect to certain illustrative embodiments thereof, it will be understood that various modifications can be made without departing from the essences and scope of the present invention which are defined in the appended claims. For example, as regards a laminated structure of a LD and a method of its manufacture as set forth in the foregoing forms of implementations illustrated, it will be appreciated that if a multi quantum well structure or the like is constructed, the feature that a crystallographic orientation of a nitride compound semiconductor is dependent on a crystallographic orientation of a cleavage is applicable to any laminated structure of multilayer of a nitride compound semiconductor irrespective to its type in so far as an epitaxial relationship between the layers congruent with each other in crystallographic orientation is retained.

INDUSTRIAL APPLICABILITY

As will be appreciated from the foregoing description, the present invention provides a (0001) faced $XB_2$ single crystal substrate having a thickness of 0.1 mm or less which can easily be cleaved along a (10-10) plane to provide a flat face and high in electrical and thermal conductivities and is thus optimum for a nitride compound semiconductor.

The present invention also realizes a LD of a vertical structure having a multilayered LD structure of a nitride compound semiconductor built on the principal surface of a $XB_2$ single crystal substrate having a pair of cleavage faces formed along (10-10) planes. Formed continuously with these cleavage faces along (10-10) planes, a pair of opposed end faces designed to provide a Fabry-Perot resonator is high in surface precision and planarity, thereby providing the Fabry-Perot resonator that is reduced in loss, increased in laser oscillation efficiency and longer in service life.

The present invention also provides a method that can make a high performance LD of a nitride compound semiconductor in simpler process steps wherein a multilayered LD structure of the nitride compound semiconductor formed on a $XB_2$ single crystal substrate is split by cleaving it parallel to a (10-10) plane of the $XB_2$ single crystal into a plurality of its divisions.

The present invention also provides a technique that can form a semiconductor device such as a LED, a photodetector, an HBT or an FET with a nitride compound semiconductor on a $XB_2$ single crystal substrate and can be realized a semiconductor device, especially a LED or an HBT, having a vertical structure.

The present invention further makes it possible to fabricate a high performance nitride compound semiconductor device in simpler process steps whereby a semiconductor structure of nitride compound semiconductor formed on a $XB_2$ single crystal substrate is split, together with the substrate, along (10-10) planes of $XB_2$ single crystal into a large number of divisions each individually constituting a semiconductor device such as a LED, a photodetector, an HBT or an FET.

What is claimed is:

1. A diboride single crystal substrate that is a single crystal substrate of diboride $XB_2$ (where X is either Zr or Ti), characterized in that the substrate is facially oriented in a (0001) plane, has a orientation flat exhibiting a (10-10) or (11-20) plane and has a thickness of 0.1 mm or less whereby the substrate can be cleaved in a (10-10) plane.

2. A semiconductor laser diode, having a multilayered active layer is formed on a substrate of diboride $XB_2$ single crystal (where X is either Zr or Ti) which is facially oriented in a (0001) plane of the single crystal, characterized in that a pair of opposed end faces defining a semiconductor laser light resonator in the multilayered active layer and opposed end faces of the diboride $XB_2$ single crystal substrate are each constituted by a cleavage face oriented parallel to a (10-10) plane of the diboride $XB_2$ single crystal substrate.

3. A semiconductor laser diode as set forth in claim 2, characterized in that the diboride $XB_2$ single crystal substrate has a thickness of 0.1 mm or less.

4. A semiconductor laser diode as set forth in claim 2 or claim 3, characterized in that the diboride $XB_2$ single crystal substrate is a $ZrB_2$ single crystal substrate, and that the multilayered active layer of the semiconductor laser diode comprises a nitride compound semiconductor ($Al_xGa_yIn_zN$ where x+y+z=1).

5. A semiconductor device that is formed on a substrate of a diboride $XB_2$ single crystal (where X is Zr or Ti) which is facially oriented in a (0001) plane of the single crystal,
characterized in that those at least at one side of side faces of the diboride $XB_2$ single crystal substrate and of a device constituting a semiconductor device are constituted by cut faces resulting from cleaving the substrate and the device parallel to a (10-10) plane of the diboride $XB_2$ single crystal substrate.

6. A semiconductor device as set forth in claim 5, characterized in that the semiconductor device is a semiconductor laser diode.

7. A semiconductor device as set forth in claim 5, characterized in that the semiconductor device is a light emitting diode.

8. A semiconductor device as set forth in claim 5, characterized in that the semiconductor device is a photo detector.

9. A semiconductor device as set forth in claim 5, characterized in that the semiconductor device is a heterojunction bipolar transistor.

10. A semiconductor device as set forth in claim 5, characterized in that the semiconductor device is a field effect transistor.

11. A semiconductor device as set forth in claim 5, characterized in that the semiconductor device is an integrated circuit.

12. A semiconductor device as set forth in any one of claims 5 to 11, characterized in that the diboride $XB_2$ single crystal substrate has a thickness of 0.1 mm or less.

13. A semiconductor device as set forth in claim 5, characterized in that the diboride $XB_2$ single crystal substrate is a $ZrB_2$ single crystal substrate and the semiconductor device comprises a nitride compound semiconductor ($Al_xGa_yIn_zN$ where x+y+z=1).

14. A method of making a semiconductor laser diode, characterized in that it comprises the steps of:
    forming active layers of the semiconductor laser diode on a substrate of a diboride $XB_2$ single crystal (where X is Zr or Ti) that is facially oriented in a (0001) plane of the single crystal; and
    scribing the diboride $XB_2$ single crystal substrate along a (10-10) plane thereof and cutting the semiconductor device's active layers together with the substrate into a plurality of their divisions each individually constituting a semiconductor laser diode.

15. A method of making a semiconductor laser diode as set forth in claim 14, characterized in that prior to the step of scribing the diboride $XB_2$ single crystal substrate along a (10-10) plane thereof and cutting the semiconductor device's active layers together with the substrate into a plurality of their divisions, the method further includes the step of thinning the diboride $XB_2$ single crystal substrate to 0.1 mm or less in thickness.

16. A method of making a semiconductor laser diode as set forth in claim 14, characterized in that the diboride $XB_2$ single crystal substrate is thinned to a thickness of 0.1 mm or less.

17. A method of making a semiconductor laser diode as set forth in any one of claims 14 to 16, characterized in that the diboride $XB_2$ single crystal substrate is a $ZrB_2$ single crystal substrate and the semiconductor laser diode has multiple active layers made of a nitride compound semiconductor ($Al_xGa_yIn_zN$ where x+y+z=1).

18. A method of making a semiconductor device, characterized in that it comprises the steps of:
    forming a semiconductor device on a substrate of a diboride $XB_2$ single crystal (where X is either Zr or Ti) that is facially oriented in a (0001) plane of the single crystal; and
    dividing the semiconductor device on the diboride $XB_2$ single crystal substrate by cutting the device parallel to a (10-10) plane of the diboride $XB_2$ single crystal substrate.

19. A method of making a semiconductor device as set forth in claim 18, characterized in that the step of cutting the device comprises cleaving.

* * * * *